(12) United States Patent
Erturk et al.

(10) Patent No.: US 10,211,761 B2
(45) Date of Patent: Feb. 19, 2019

(54) SYSTEMS AND METHODS FOR HARVESTING PIEZOELECTRIC ENERGY FROM HYDRAULIC PRESSURE FLUCTUATIONS

(71) Applicant: Georgia Tech Research Corporation, Atlanta, GA (US)

(72) Inventors: Alper Erturk, Atlanta, GA (US); Kenneth A. Cunefare, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 517 days.

(21) Appl. No.: 14/895,698

(22) PCT Filed: Jun. 5, 2014

(86) PCT No.: PCT/US2014/041125
§ 371 (c)(1),
(2) Date: Dec. 3, 2015

(87) PCT Pub. No.: WO2014/197712
PCT Pub. Date: Dec. 11, 2014

(65) Prior Publication Data
US 2016/0126868 A1    May 5, 2016

Related U.S. Application Data

(60) Provisional application No. 61/831,875, filed on Jun. 6, 2013.

(51) Int. Cl.
*H01L 41/113* (2006.01)
*H02N 2/18* (2006.01)

(52) U.S. Cl.
CPC ........... *H02N 2/186* (2013.01); *H01L 41/113* (2013.01); *H02N 2/181* (2013.01); *H02N 2/185* (2013.01)

(58) Field of Classification Search
CPC ........ H02N 2/181; H02N 2/185; H02N 2/186; H01L 41/113
(Continued)

(56) References Cited

U.S. PATENT DOCUMENTS 2,532,098 A * 11/1950 Holcomb ................. H03G 5/22
                                                 369/47.25
9,634,581 B2 * 4/2017 Jaffrey ..................... H02N 2/185
(Continued)

FOREIGN PATENT DOCUMENTS

CN       1610209       4/2005
DE   102011086256 A1 *  5/2013 .............. F03B 13/14
(Continued)

OTHER PUBLICATIONS

Search Report and Opinion from related European Application No. EP14807102 dated Dec. 22, 2016 (6 pages).
(Continued)

*Primary Examiner* — Thomas Dougherty
(74) *Attorney, Agent, or Firm* — Troutman Sanders LLP; Ryan A. Schneider

(57) ABSTRACT

Aspects of the present disclosure relate to systems and methods for harvesting energy from the pressure ripple of a fluid system. In an example embodiment, a system comprises a housing; a piezoelectric stack in fluid communication with a pressure ripple of a fluid system and configured to generate a piezoelectric voltage and an associated piezoelectric current in response to pressure ripple characteristics, wherein the piezoelectric stack is disposed within the housing; and regulatory circuitry in electrical communication with the piezoelectric stack and configured to convert the piezoelectric current into DC voltage.

20 Claims, 21 Drawing Sheets

(58) Field of Classification Search
　　　USPC .......................................................... 310/339
　　　See application file for complete search history.

(56) References Cited

U.S. PATENT DOCUMENTS

| | | | |
|---|---|---|---|
| 2010/0109331 A1 | 5/2010 | Hedtke et al. | |
| 2010/0219646 A1* | 9/2010 | Hay | E21B 41/0085 290/1 A |
| 2012/0234095 A1 | 9/2012 | Rastegar | |
| 2017/0204839 A1* | 7/2017 | Hsu | F03G 7/08 |

FOREIGN PATENT DOCUMENTS

| | | |
|---|---|---|
| JP | 2010-311768 | 11/1998 |
| JP | 2004-364435 | 12/2004 |
| JP | 2008-184520 | 8/2008 |
| JP | 2010-032406 | 2/2010 |
| JP | 2012-080596 | 4/2012 |
| JP | 6043538 | 12/2016 |
| WO | 2012042259 | 4/2012 |

OTHER PUBLICATIONS

Office Action from related Chinese Application No. 2014800433716 dated Mar. 1, 2017 (19 pages, including 10 pages of English translation).

International Search Report and Written Opinion in related PCT Application No. PCT/US2014/041125, dated Sep. 24, 2014.

Cunefare, et al., "Energy Harvesting From Hydraulic Pressure Fluctuations," Smart Mater, Struct. 22 (2013) Jan. 29, 2013.

Examination Report from related European Application No. 14807102.0 dated Aug. 21, 2017 (3 pages).

Office Action from related Japanese application No. 2016-518000 dated Apr. 19, 2018 (9 pages of English translation).

* cited by examiner

SYSTEMS AND METHODS FOR HARVESTING PIEZOELECTRIC ENERGY FROM HYDRAULIC PRESSURE FLUCTUATIONS

CROSS-REFERENCE TO RELATED APPLICATIONS

This application is a US National Stage of International Application No. PCT/US2014/041125, filed 5 Jun. 2014, which claims the benefit of US Provisional Application No. 61/831,875, filed on 6 Jun. 2013, both herein fully incorporated by reference.

BACKGROUND

Energy harvesting from low-energy-density sources such as wind turbulence and structural vibration has been a hot topic for research, and much work has been invested worldwide. The typical application for energy harvesting has been for powering sensors and wireless communications nodes.

In a hydraulic system, distributed sensors are common, and health-monitoring systems are being deployed within the hydraulics industry, and remote sensing and monitoring is common in processing industries. Whereas the commonly explored energy harvester technologies developed to date (e.g., wind turbulence and structural vibration) have been applied to energy sources of relatively low energy density, hydraulic pressure fluctuations (i.e., the pressure ripple in a hydraulic system) represent a relatively high energy density source by comparison. The pressure ripple present within most hydraulic systems, or within any fluid system subject to pumping action, is commonly viewed as an annoyance or a detriment to system performance; however, the pressure ripple may also represent a power source for energy harvesting.

Therefore, there is a long-felt but unresolved need for systems or methods that harvest energy from the pressure ripple present within a hydraulic or other fluid system.

SUMMARY

Briefly described, and according to one embodiment, aspects of the present disclosure generally relate to systems and methods for harvesting piezoelectric energy from hydraulic pressure fluctuations.

In some embodiments of the disclosed technology, a system comprises a housing; a piezoelectric stack in fluid communication with a pressure ripple of a fluid system and configured to generate a piezoelectric voltage and an associated piezoelectric current in response to pressure ripple characteristics, wherein the piezoelectric stack is disposed within the housing; and regulatory circuitry in electrical communication with the piezoelectric stack and configured to convert the piezoelectric current into DC voltage.

In further embodiments of the disclosed technology, a system comprises an outer housing comprising a body disposed between a first end and a second end. The system further comprises a multilayer piezoelectric stack comprising a plurality of axially-poled piezoelectric layers combined in parallel, and comprising a top surface and a bottom surface, wherein the piezoelectric stack is disposed within the body of the outer housing, and wherein the piezoelectric stack is configured to generate a piezoelectric voltage in response to pressure ripple characteristics. Further, the system comprises an interface comprising a top surface and a bottom surface, wherein the bottom surface of the interface is in fluid communication with a pressure ripple of a fluid system and the top surface of the interface is in mechanical communication with the bottom surface of the piezoelectric stack, and wherein the interface is configured to transfer pressure ripple characteristics to the piezoelectric stack. Finally, the system comprises regulatory circuitry, wherein the piezoelectric stack is shunted through the regulatory circuitry, and wherein the regulatory circuitry is configured to convert piezoelectric current into DC voltage, wherein the piezoelectric current is associated with the piezoelectric voltage, and the piezoelectric current flows into the regulatory circuitry from the piezoelectric stack.

In further embodiments of the disclosed technology, a method comprises receiving, at an interface, pressure ripple characteristics, wherein the interface is mechanically coupled to a piezoelectric stack. The method further comprises, responsive to receiving pressure ripple characteristics at the interface, generating, via the piezoelectric stack, piezoelectric voltage and an associated piezoelectric current, wherein the piezoelectric stack is shunted through regulatory circuitry. The method further comprises generating, via the regulatory circuitry, DC voltage, wherein the piezoelectric current associated with the piezoelectric voltage flows from the piezoelectric stack to the regulatory circuitry.

These and other aspects, features, and benefits of the claimed invention(s) will become apparent from the following detailed written description of the preferred embodiments and aspects taken in conjunction with the following drawings, although variations and modifications thereto may be effected without departing from the spirit and scope of the novel concepts of the disclosure.

BRIEF DESCRIPTION OF THE DRAWINGS

The accompanying drawings illustrate one or more embodiments and/or aspects of the disclosure and, together with the written description, serve to explain the principles of the disclosure. Wherever possible, the same reference numbers are used throughout the drawings to refer to the same or like elements of an embodiment, and wherein.

DETAILED DESCRIPTION

Figure 1:
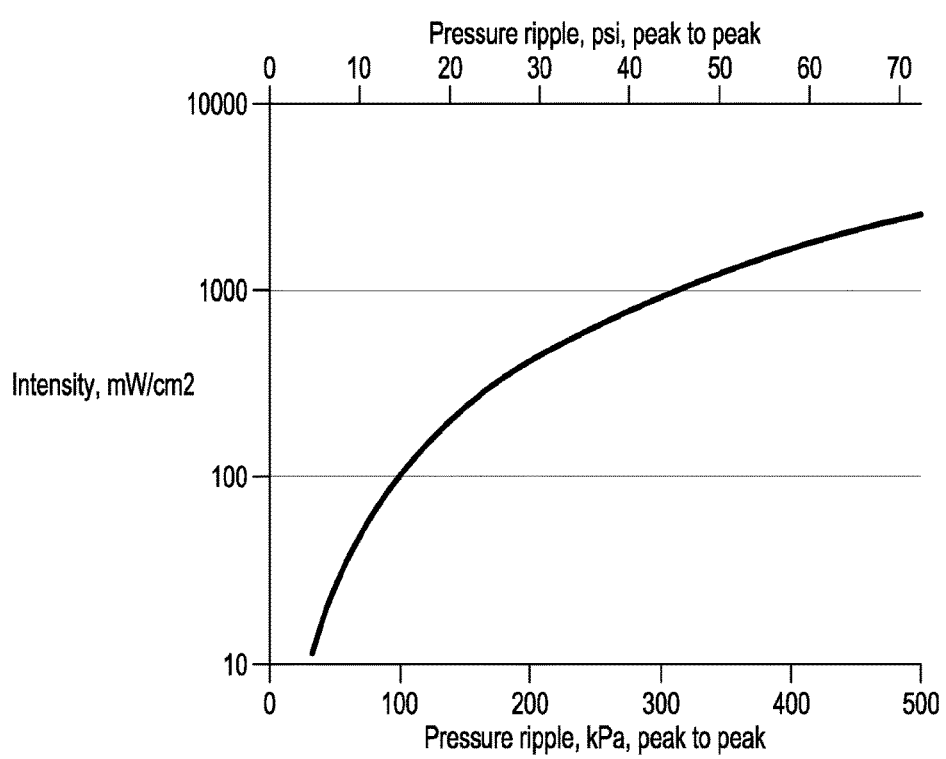
FIG. 1 illustrates the power per unit area measured in milliwatts per centimeter squared that is conveyed in the pressure ripple of a hydraulic system driven by an axial piston pump at 270 Hz, according to an exemplary embodiment.

Prior to a detailed description of the disclosure, the following symbol definitions are provided as an aid to understanding the subject matter and terminology of aspects of the present systems and methods. These symbols presume the use of 33-poled piezoelectric materials, though in other embodiments, various other piezoelectric materials may be utilized. Further, any symbol definitions or other terms are exemplary, and are not necessarily limiting of the aspects of the systems and methods, which are expressed in the claims. Whether or not a term is capitalized is not considered definitive or limiting of the meaning of a term. As used in this document, a capitalized term shall have the same meaning as an uncapitalized term, unless the context of the usage specifically indicates that a more restrictive meaning for the capitalized term is intended. But, the capitalization or lack thereof within the remainder of this document is not intended to be necessarily limiting unless the context clearly indicates that such limitation is intended.

Symbol Definitions $k_{33}$: Electromechanical coupling coefficient
$E_p^E$: Elastic modulus of short-circuited piezoelectric actuator or stack
$E_p^D = E_p^E (1-k_{33}^2)^{-1}$: Elastic modulus of open-circuited piezoelectric actuator or stack
$E_p^{SU}$: Elastic modulus of shunted patch, complex values permitted
$E_p^{SU} = E_d + iE_l$: Complex modulus of shunted piezoelectric actuator or stack
$E_d$: Dynamic modulus
$E_l$: Loss modulus
$\kappa = E_d/E_p^E$: Non-dimensional dynamic modulus (stiffness)
$\mu = E_l/E_p^E$: Non-dimensional loss modulus
$C_p^T$: Inherent piezoelectric actuator or stack capacitance at constant stress
$C_p^s = C_p^T (1-k_{33}^2)$: Piezoelectric actuator or stack capacitance at constant strain
$Z^{SU}$: impedance of shunt circuit across piezoelectric actuator or stack
$Z^D$: open circuit impedance of piezoelectric actuator or stack
$Z^{EL}$: impedance of shunt circuit in parallel with piezoelectric actuator or stack Overview For the purpose of promoting an understanding of the principles of the present disclosure, reference will now be made to the embodiments illustrated in the drawings and specific language will be used to describe the same. It will, nevertheless, be understood that no limitation of the scope of the disclosure is thereby intended; any alterations and further modifications of the described or illustrated embodiments, and any further applications of the principles of the disclosure as illustrated therein are contemplated as would normally occur to one skilled in the art to which the disclosure relates. All limitations of scope should be determined in accordance with and as expressed in the claims.

Aspects of the present disclosure generally relate to systems and methods for harvesting energy from the pressure ripple present within most hydraulic systems, or within any fluid system subject to pumping action. As will be discussed, significant energy is available in the pressure ripple, which can be converted in a pressure-to-electrical-power conversion via the disclosed systems and methods. For example, many hydraulic systems utilize health-monitoring sensors, which intelligently monitor the integrity of the system, including the hose assemblies, and provide notifications for when hoses should be replaced. Such systems, however, typically require external power sources (e.g., batteries, wires, etc.). In one embodiment, the disclosed systems and methods could be integrated into such health-monitoring systems, thus eliminating the need for external power sources, which would reduce overall maintenance contact and eliminate potential points of failure.

Figure 2:
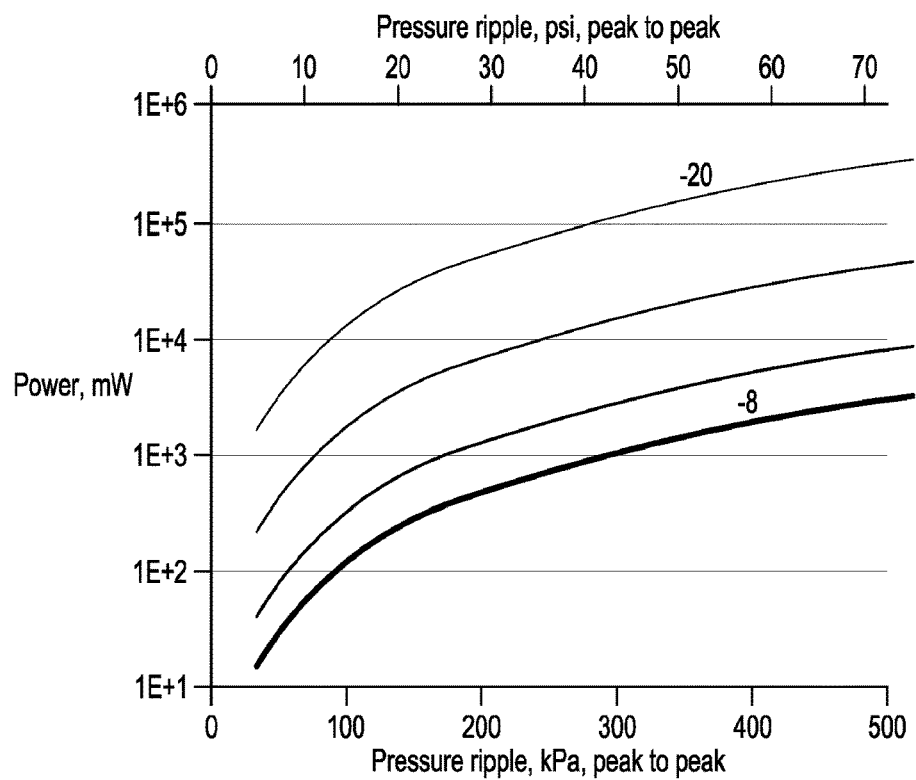
FIG. 2 illustrates the actual power conveyed in the pressure ripple of a hydraulic system driven by an axial piston pump at 270 Hz, measured in milliwatts, in hoses having varying diameters, according to an exemplary embodiment.

FIG. 1 depicts the power per unit area (i.e., intensity), measured in milliwatts per centimeter squared (mW/cm$^2$), that is conveyed in the pressure ripple (or ripple) of a hydraulic system driven by an axial piston pump at 270 Hz. FIG. 2 depicts the actual power conveyed in the pressure ripple of a hydraulic system driven by an axial piston pump at 270 Hz., measured in milliwatts (mW), in hoses having varying diameters. As shown in FIGS. 1 and 2, the vertical axis scales are in units of milliwatts, as sensor node powering applications generally require milliwatts-level power. As will be understood and appreciated, for larger diameter pipes, the power available in the pressure ripple is larger (e.g., the power available may be measured in watts), which would enable energy uses beyond sensors and communications.

Accordingly, as will be discussed, in example embodiments, a pressure-to-electrical conversion system comprising a piezoelectric material core (i.e., a Hydraulic Pressure Energy Harvester or HPEH) can generate sufficient power from a pressure ripple to power, for example, a sensor transmission node. In various embodiments, one or more HPEH's may be used as stand-alone add-ons that can be integrated into a hydraulic system. Further, one or more HPEH's may be directly integrated into components of a mobile hydraulic system (e.g., inspection robots or free-swimming sensor platforms deployed into hydraulic systems). In various embodiments, an HPEH may be used as a standalone device on fluid systems (i.e., pumped fluid systems). For example, an HPEH may be used in a water and/or petroleum pipelines to power sensors that monitor the pipelines. Further, in various embodiments, an HPEH may be used as a standalone or as an add-on (i.e., may be integrated into) to hydraulic components such as pumps, actuators, and valves. In particular, one or more HPEH's may be to provide power for sensors used in conjunction with such components. Further, in various embodiments, one or more HPEH's may be used within pumped fluid components (e.g., to provide power for sensors used in conjunction with such components). Likewise, one or more HPEH's may be used in conjunction with pressurized pumped lubrication delivery systems (e.g., oiling systems on internal combustion or turbine engines or steam engines).

Figure 3:
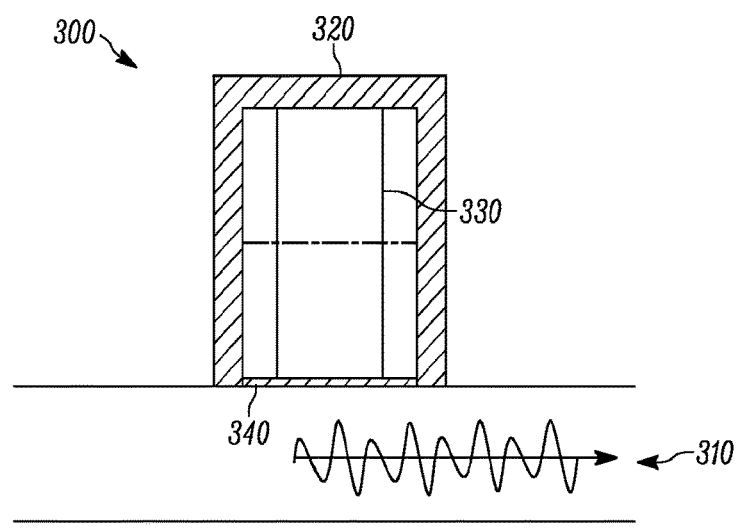
FIG. 3 is a schematic representation of a hydraulic pressure energy harvester (HPEH) installed on a fluid piping system, according to an exemplary embodiment.

In example embodiments, the required volume of piezoelectric material in an HPEH may be dependent upon the energy required per sensor sampling event, the rate of sampling events, and the pressure magnitude and frequency content of the pressure ripple. As shown in FIG. 3, in one embodiment, an HPEH 300 is exposed to pressure ripple 310 in a fluid system. In one embodiment, an HPEH 300 comprises a housing 320, piezoelectric stack 330 (i.e., multiple axially-poled piezoelectric layers combined in parallel), and an interface 340.

As will be understood and appreciated, in certain embodiments, it is necessary to seal off the piezoelectric stack (i.e., active element) from the system's hydraulic fluid so as to ensure no leakage into the environment. Further, sealing the piezoelectric stack (i.e., active element) from the hydraulic fluid promotes uniaxial loading, which is preferable to (although not necessary) hydrostatic loading, as it increases the energy harvesting efficiency of the HPEH 300. Typically, a seal is affected between the housing 320 (i.e., body) of an HPEH 300 and the interface 340 (e.g., a metal diaphragm). Certain embodiments may employ various sealing methods. For example, in one embodiment, an HPEH 300 may employ a clamped metal-to-metal seal. In one embodiment, an HPEH 300 may employ a seal comprising an adhesive. Further, in one embodiment, an HPEH 300 may employ an interference-fit metal-to-metal seal, which may include a variant where a component is installed at elevated or lower temperature so as to exploit thermal expansion or contraction.

Figure 4:
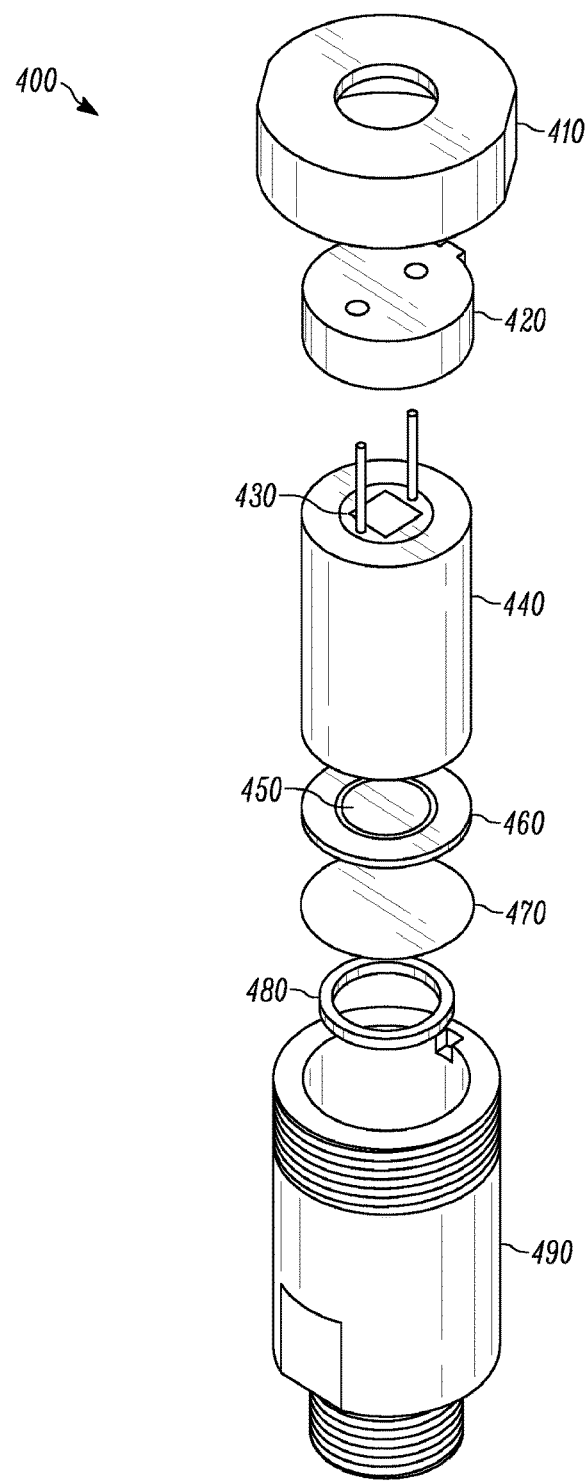
FIG. 4 is an exploded view of a configuration of an HPEH 400, according to an exemplary embodiment.

FIG. 4 is an exploded view of an exemplary embodiment of an HPEH 400. As shown, the HPEH 400 illustrated in FIG. 4 comprises an end cap 410 that can be detachably attached to an outer housing 490. Further, as shown in FIG. 4, an HPEH 400 may comprise a piezoelectric stack ("piezo stack") 430, which may be a multi-layer piezo stack disposed within an inner sleeve 440, according to one embodiment. In one embodiment, a piezoelectric stack (e.g., piezo stack 430) may comprise a single layer. Further, as shown in FIG. 4, the piezo stack 430 and inner sleeve 440 may be separated from the end cap 410 by a keyed spacer 420. Additionally, the piezo stack 430 and inner sleeve 440 may be separated from an interface 470 (e.g., diaphragm) by an interface (or diaphragm) washer 460 and interface (or diaphragm) spacer 450, which may be referred to collectively or individually as a force transmission element. In alternate embodiments, diaphragm washer 460 and/or diaphragm spacer 450 may be excluded from the HPEH 400. By including a diaphragm washer 460 and/or diaphragm spacer 450 (i.e., a force transmission element), however, applied force into the piezo stack 430 is greater as the diaphragm 470 bears against the diaphragm spacer 450, which has a greater surface area than the cross-sectional area of the piezo stack 430. As will be appreciated, this may ensure uniform loading across the bottom surface of the piezoelectric stack. In one embodiment, the diaphragm 470 may be a limp diaphragm. A limp diaphragm may ensure the maximum transmission of force from the hydraulic fluid into the piezoelectric material (i.e., piezo stack 430). The HPEH 400 may also comprise an o-ring 480, which may have a square cross-section, as shown in FIG. 4.

In one embodiment, the HPEH 400 may employ a metal-to-metal seal. The metal-to-metal seal may be achieved by capturing the diaphragm 470 between an interior shoulder of the outer housing 490 (not shown) and a face of the inner sleeve 440. To achieve the metal-to-metal seal, clamping pressure may be applied on the diaphragm 470 by the end cap 410 loading against the inner sleeve 440 as the end cap 410 is detachably attached (e.g. threaded) onto the outer housing 490. Further, in one embodiment, the HPEH 400 may comprise a plurality of piezo stacks 430.

Figure 5:
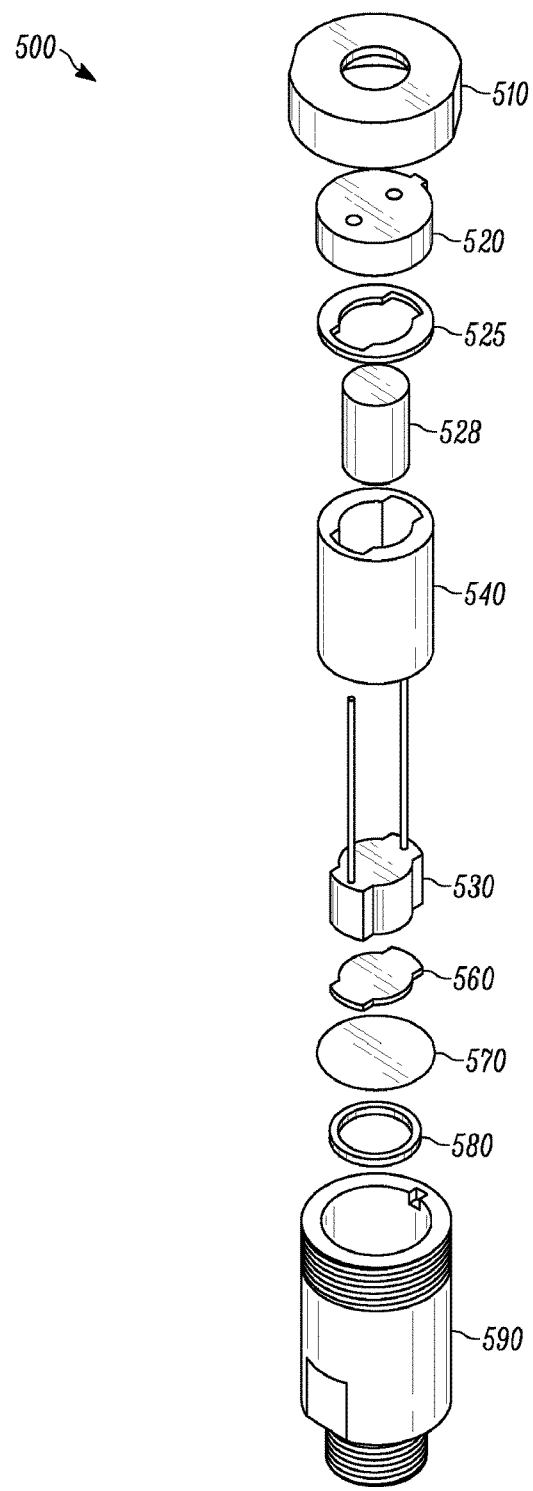
FIG. 5 is an exploded view of a configuration of an HPEH 500, according to an exemplary embodiment.

FIG. 5 is an exploded view of an alternate embodiment of an HPEH 500. As shown, the HPEH 500 illustrated in FIG. 5 comprises an end cap 510 that can be detachably attached to an outer housing 590. In certain embodiments, an HPEH 500 may comprise a piezo stack 530, which may have certain properties (e.g., capacitance) that affect the geometric dimensions of the piezo stack 530, thus necessitating the use of an inner spacer 528. Accordingly, as is shown in FIG. 5, an HPEH 500 may comprise a piezo stack 530 and inner spacer 528 disposed within an inner sleeve 540. Further, as shown in FIG. 5, the inner sleeve 540 and inner spacer 528 may be separated from the end cap 510 by a keyed spacer 520. Additionally, the inner sleeve 540 and piezo stack 530 may be separated from a diaphragm 570 by a diaphragm load washer 560. An HPEH 500 may also comprise an o-ring 580, which may have a square cross-section.

Figure 6A:
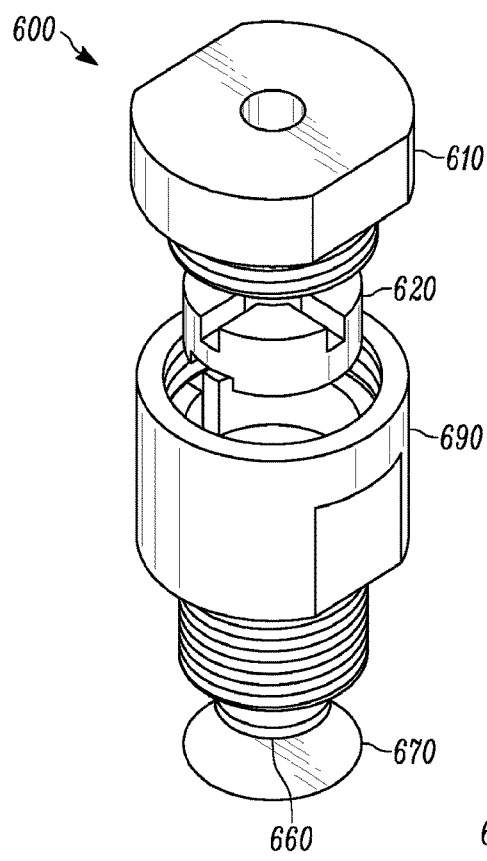
FIG. 6A is an exploded view of a configuration of an HPEH 600, according to an exemplary embodiment.
Figure 6B:
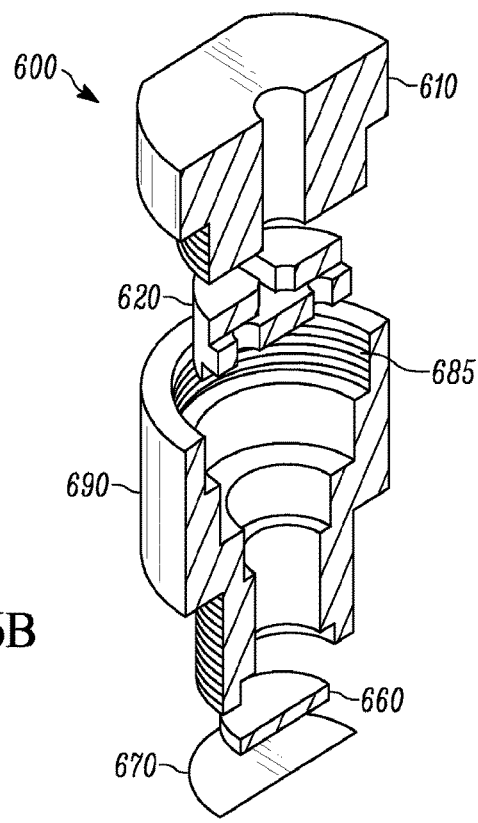
FIG. 6B is a cross-section of HPEH 600, according to an exemplary embodiment.

FIG. 6A is an exploded view of an alternate embodiment of an HPEH 600, while FIG. 6B is a cross section of HPEH 600. As shown, in one embodiment, an HPEH 600 may comprise an end cap 610 that can be detachably attached to an outer housing 690. HPEH 600 may be configured to employ a piezo stack with smaller dimensions (not shown) that is disposed within the outer housing 690. The piezo stack may be separated from the end cap 610 by a keyed spacer 620. Further, the piezo stack may be separated from a diaphragm 670 by a washer 660. In one embodiment, the body of HPEH 600 may be sealed at the bottom of the outer housing 690, as opposed to sealing internal to the outer housing, as was shown in FIGS. 4 and 5. Further, in one embodiment, the HPEH 600 may comprise internal threading 685 as opposed to external threading, as was shown in FIGS. 4 and 5.

Figure 7A:
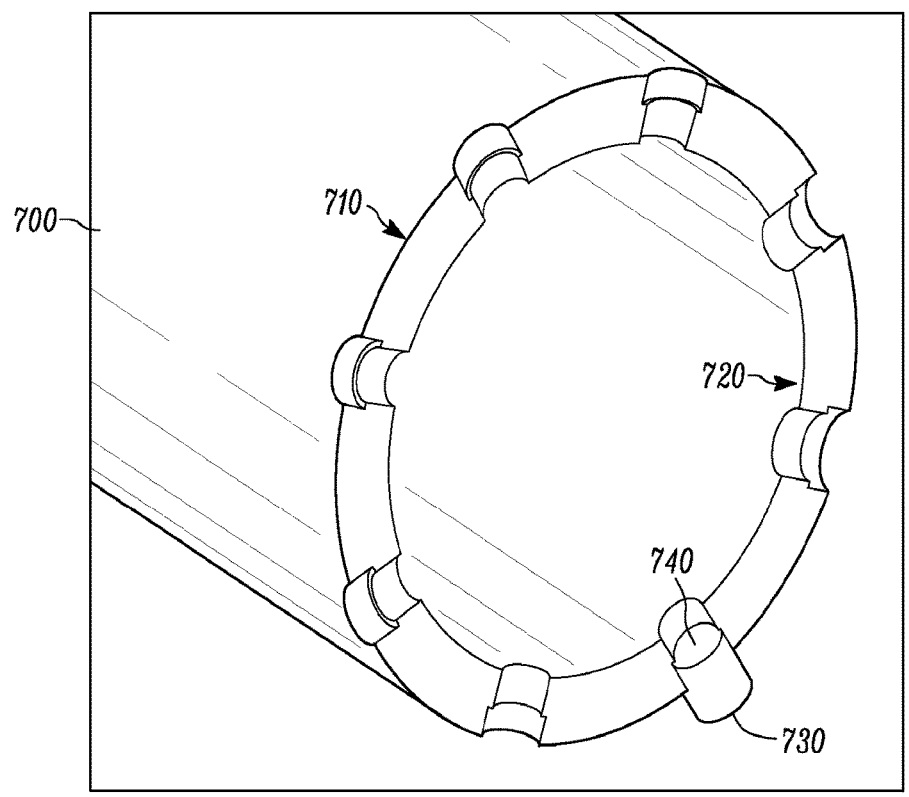
FIG. 7A is a conduit configured to house one or more insertable HPEH's such that the one or more insertable HPEH's can be threaded into the hose or pipe through the exterior wall of the hose or pipe, according to an exemplary embodiment.

FIG. 7A is an exemplary embodiment of a conduit (e.g., hose or pipe) 700 configured to house one or more HPEH's (e.g., HPEH 400, HPEH 500, or HPEH 600). As shown in FIG. 7A, the conduit 700 (e.g., hose or pipe) is configured such that the HPEH (e.g., HPEH 400) can be threaded into the conduit 700 through the exterior wall 710 of the conduit 700 (e.g., hose or pipe) such that, when the HPEH (e.g., HPEH 400) is fully installed, the interior wall 720 of the conduit 700 and the diaphragm 470 are substantially aligned.

Figure 7B:
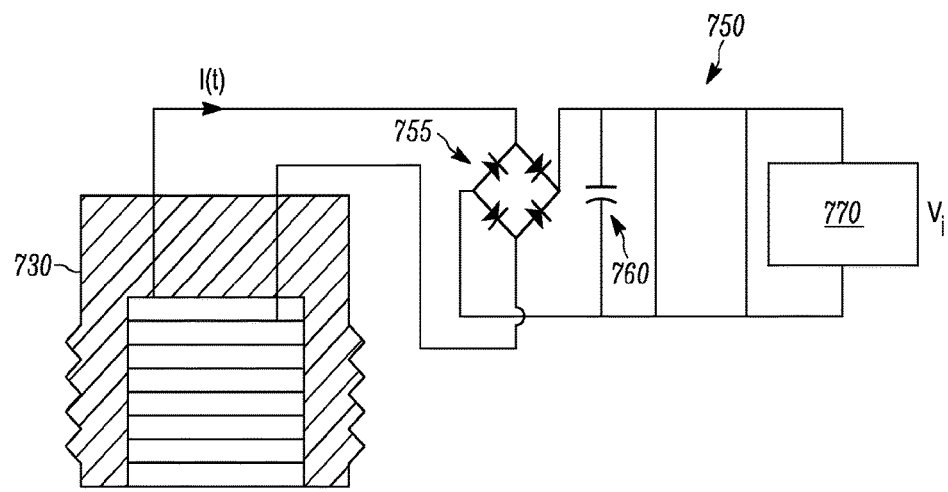
FIG. 7B is a schematic of an insertable HPEH 730, configured for threading into a conduit through the exterior wall of the conduit, with regulatory circuitry 750, according to an exemplary embodiment.

FIG. 7B is a schematic of an insertable HPEH 730, according to one embodiment, configured for threading through the exterior wall of a hose or pipe (e.g., hose or pipe 700). As shown in FIG. 7B, the HPEH 730 further comprises regulatory circuitry 750, according to one embodiment. The regulatory circuitry 750 is configured as an AC-DC converter (i.e., a one-stage energy harvesting interface) combined with a DC-DC converter (or regulator), according to one embodiment. In example embodiments, the alternating piezoelectric current (I), which may be induced by hydraulic pressure fluctuations, flows to the full-wave rectifier 755. In one embodiment, the rectifier is followed by a smoothing capacitor 760 to obtain a constant voltage. In one embodiment, after the smoothing capacitor 760, the DC voltage is regulated to reach the voltage level ($V_t$) of the external load or storage component 770. In certain embodiments, the DC-DC converter may be a step-down converter. Further, in certain embodiments, the piezoelectric stack (e.g., piezo stack 530) may be configured such that the layers of the stack are combined in parallel to increase current (I) while keeping voltage at relatively low values, which may simplify the regulation process in the regulatory circuitry 750.

Figure 7C:
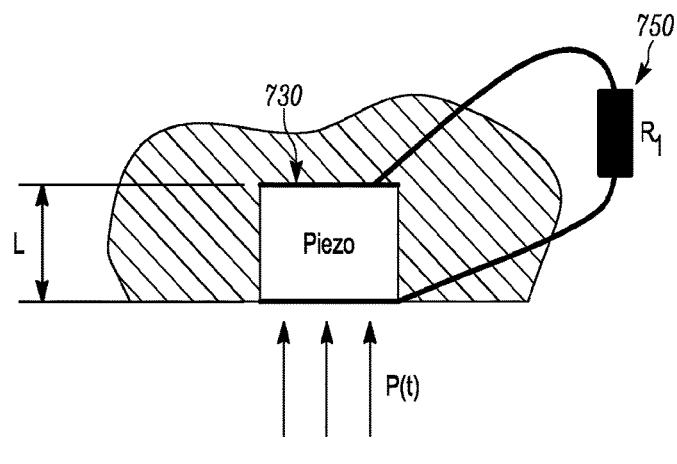
FIG. 7C is a semi-sectional view of an HPEH with regulatory circuitry, according to an exemplary embodiment.

FIG. 7C is a semi-sectional view of an HPEH (e.g., HPEH 730) or piezoelectric insert with regulatory circuitry (e.g., regulatory circuitry 750), according to one embodiment. The HPEH 730 may be, for example, cube-, cuboid-, or cylinder-shaped, according to various embodiments. As shown in FIG. 7C, the HPEH 730 is axially poled, according to one embodiment. As will be discussed and derived below, electromechanical modeling of piezoelectric power generation from an axially poled cylindrical, cubic, or cuboid piezoelectric insert of volume $V_p$ (e.g., HPEH 730) yields a normalized power output that may be given as shown in Equation (8) below.

Figure 8A:
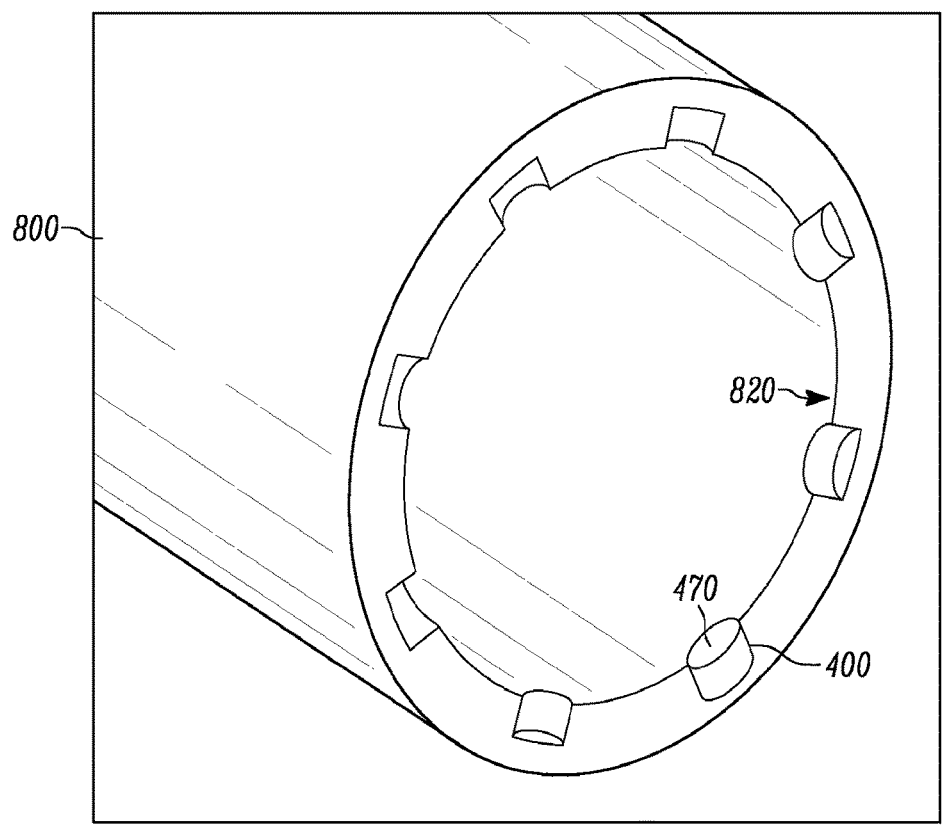
FIG. 8A is a conduit configured to house one or more HPEH's such that the one or more HPEH's can be threaded into the conduit through the interior wall of the conduit, according to an exemplary embodiment.
Figure 8B:
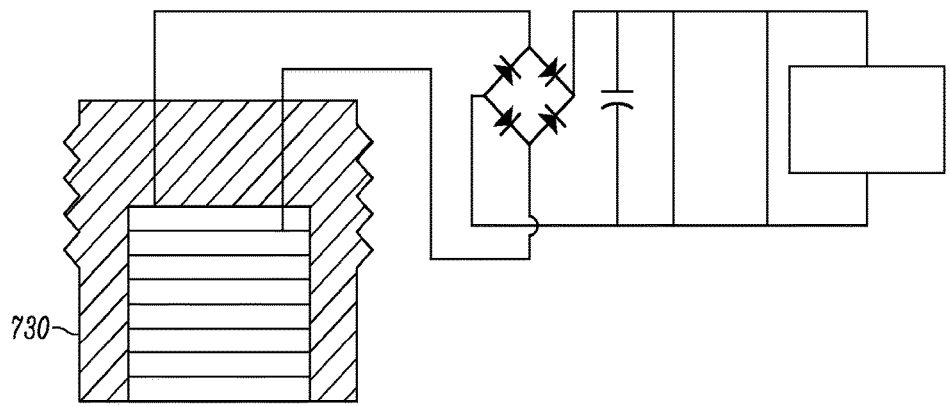
FIG. 8B is a schematic of an insertable HPEH 830, configured for threading into a conduit through the interior wall of the conduit, with regulatory circuitry, according to an exemplary embodiment.

FIG. 8A is an additional exemplary embodiment of a hose or pipe 800 configured to house one or more HPEH's (e.g., HPEH 730). As shown in FIG. 8A, the hose or pipe 800 is configured such that the HPEH (e.g., HPEH 730) can be threaded into the hose or pipe 800 through the interior wall 820. When fully seated, the bottom surface of the piezoelectric stack (or diaphragm) and the interior wall 820 of the hose or pipe 800 are substantially aligned. FIG. 8B is a schematic of an insertable HPEH 830, according to one embodiment, configured for threading into the interior wall of a hose or pipe (e.g., hose or pipe 800), with regulatory circuitry (e.g., regulatory circuitry 750).

Figure 9:
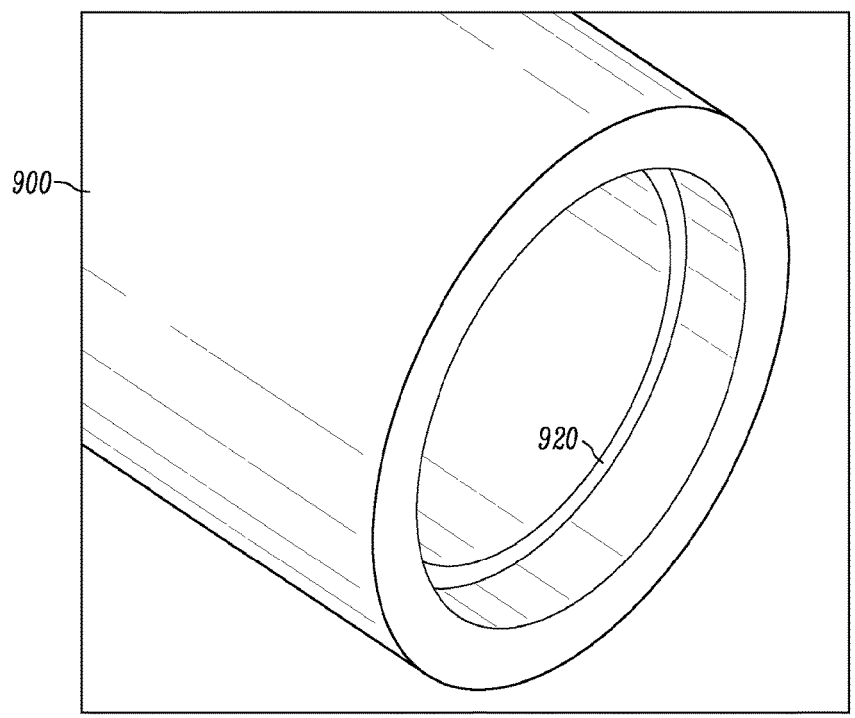
FIG. 9 is an HPEH 900 configured as an annulus and disposed within a conduit, according to an exemplary embodiment.
Figure 10A:
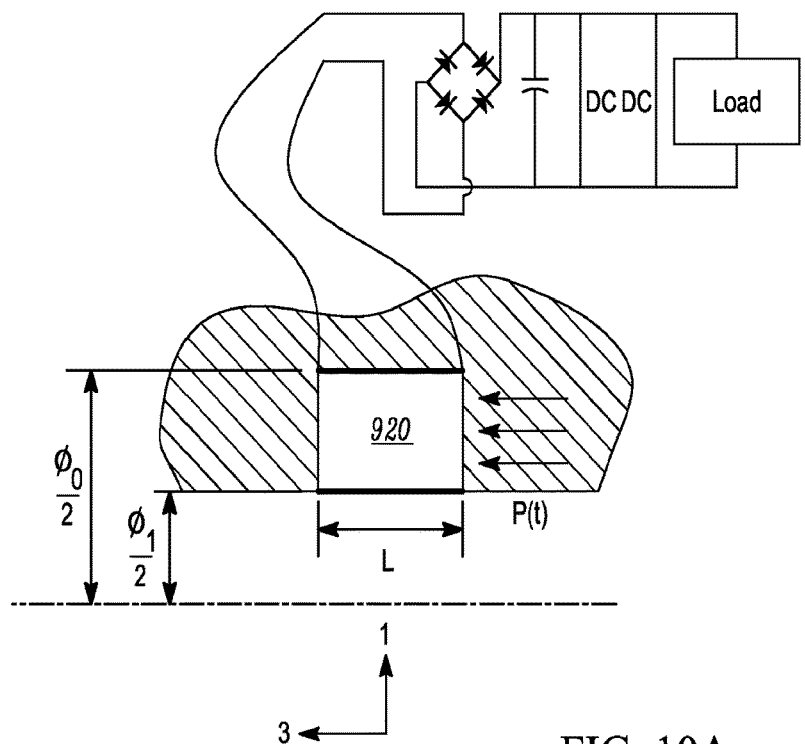
FIG. 10A is a semi-sectional view of an HPEH 920 configured as an annulus that is axially poled, with regulatory circuitry, according to an exemplary embodiment.
Figure 10B:
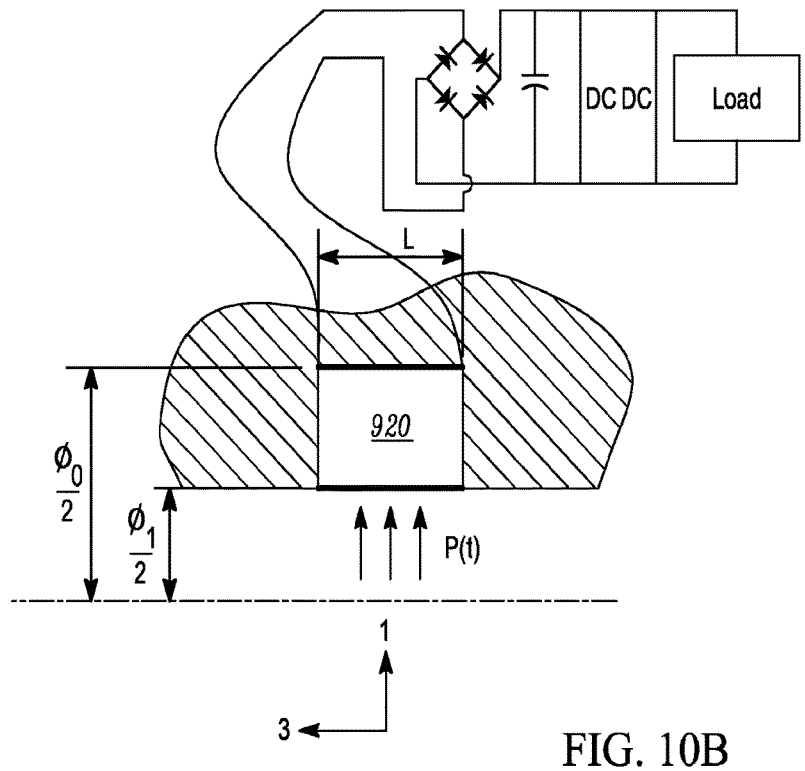
FIG. 10B is a semi-sectional view of an HPEH 920 configured as an annulus that is radially poled, with regulatory circuitry, according to an exemplary embodiment.

FIG. 9 is an exemplary embodiment of an HPEH 920 configured as an annulus and disposed within a hose or pipe 900. In one embodiment, the HPEH 920 configured as an annulus may be axially poled. Alternatively, the HPEH 920 configured as an annulus may be radially poled. FIGS. 10A and 10B are semi-sectional views of an HPEH 920 configured as an annulus with regulatory circuitry (similar to that discussed above in relation to FIG. 7B), according to one embodiment. As shown in FIG. 10A, the HPEH 920 is axially-poled (i.e., the electrode pair covers the annular faces), and in FIG. 10B, the HPEH 920 is radially-poled i.e., the electrode pair covers the lateral faces).

Axially-Poled Annulus Analysis

Assuming the frequency spectrum of the pressure fluctuation to be sufficiently below the fundamental resonance frequency of the piezoelectric annulus, for an HPEH 920 configured as an annulus that is axially-poled, as is shown in FIG. 10A, the AC circuit equation is obtained from:

$$\frac{d}{dt}\left(\int_A D \cdot n \, dA\right) = \qquad (1)$$

$$\frac{d}{dt}(d_{33}T_3 A_e + \varepsilon_{33}^T A_e E_3) = \frac{d}{dt}\left(d_{33}PA_e - \varepsilon_{33}^T A_e \frac{v}{L}\right) = \frac{v}{R_l}$$

where v is the voltage output, $d_{33}$ is the piezoelectric constant, $T_3$ is the stress component, $\varepsilon_{33}^T$ is the permittivity component at constant stress, $R_l$ is the electrical load resistance, L is the length, and $A_e = \pi(\phi_o^2 - \phi_i^2)/4$ is the electrode area (here, $\phi_o$ and $\phi_i$ are the outer and inner diameters of the annulus, respectively).

Equation (1) yields:

$$C_p \frac{dv}{dt} + \frac{v}{R_l} = A_e d_{33} \frac{dP}{dt} \qquad (2)$$

where the capacitance is given by:

$$C_p = \frac{\varepsilon_{33}^T A_e}{L} = \frac{\varepsilon_{33}^T \pi (\phi_o^2 - \phi_i^2)}{4L} \quad (3)$$

If the pressure fluctuation is harmonic of the form $P=P_0 e^{j\omega t}$ (therefore $P_0$ is half of the pressure ripple value), then, at steady state:

$$v(t) = j\omega A_e d_{33} P_0 \left( j\omega C_p + \frac{1}{R_l} \right)^{-1} e^{j\omega t} \quad (4)$$

Here, again, it is assumed that $\omega < \omega_1$, where $\omega_1$ is the fundamental resonance frequency of the piezoelectric annulus.

Equation (4) leads to the power amplitude of:

$$\Pi = \left| \frac{v^2(t)}{R_l} \right| = \frac{\omega^2 A_e^2 d_{33}^2 P_0^2 R_l}{1 + \omega^2 R_l^2 C_p^2} \quad (5)$$

It follows from Equation (5) that:

$$\left. \frac{\partial \Pi}{\partial R_l} \right|_{R_l = R_l^{opt}} = 0 \rightarrow R_l^{opt} = \frac{1}{\omega C_p} = \frac{4L}{\omega \varepsilon_{33}^T \pi (\phi_o^2 - \phi_i^2)} \quad (6)$$

Therefore, the AC power amplitude for the optimal load is:

$$\Pi_{max} = \Pi \big|_{R_l = R_l^{opt}} = \frac{\omega A_e^2 d_{33}^2 P_0^2}{2 C_p} = \frac{\omega \pi (\phi_o^2 - \phi_i^2) L d_{33}^2 P_0^2}{8 \varepsilon_{33}^T} \quad (7)$$

Normalizing the maximum power output with the excitation frequency $f=\omega/2\pi$ yields:

$$\alpha = \frac{\Pi_{max}}{f} = \frac{\pi^2 d_{33}^2}{4 \varepsilon_{33}^T} (\phi_o^2 - \phi_i^2) L P_0^2 = \frac{\pi d_{33}^2}{\varepsilon_{33}^T} V_p P_0^2 \quad (8)$$

where $V_p$ is the volume of the piezoelectric annulus. Equation (8) may be rearranged to determine the volume of piezoelectric material required to obtain a specified normalized power out at a given pressure amplitude, which may be determined according to the application in which the HPEH is used. Accordingly:

$$V_p = \alpha \frac{\varepsilon_{33}^T}{\pi P_0^2 d_{33}^2} \quad (9)$$

Radially-Poled Annulus Analysis

In the case of an HPEH 920 configured as an annulus that is radially-poled, as shown in FIG. 10B, assuming the frequency spectrum of the pressure fluctuation is far below the fundamental resonance frequency of the annulus, the AC circuit equation is:

$$\frac{d}{dt}\left( \int_A D \cdot n dA \right) = \quad (10)$$

$$\frac{d}{dt}(d_{33} T_3 A_e + \varepsilon_{33}^T A_e E_3) = \frac{d}{dt}\left( d_{33} P A_e - \varepsilon_{33}^T A_e \frac{v}{h_p} \right) = \frac{v}{R_l}$$

where $A_e = \pi(\phi_o + \phi_i)L/2$ is the effective electrode area for the average diameter between the outer) ($\phi_o$) and inner ($\phi_i$) diameters as an approximation.

Equation (10) gives:

$$C_p \frac{dv}{dt} + \frac{v}{R_l} = A_e d_{33} \frac{dP}{dt} \quad (11)$$

where the effective capacitance is given by:

$$C_p = \frac{\varepsilon_{33}^T A_e}{(\phi_o - \phi_i)/2} = \frac{\varepsilon_{33}^T \pi (\phi_o - \phi_i) L}{(\phi_o - \phi_i)} \quad (12)$$

If the pressure fluctuation is $P=P_0 e^{j\omega t}$, then the steady-state voltage response is given by:

$$v(t) = j\omega A_e d_{33} P_0 \left( j\omega C_p + \frac{1}{R_l} \right)^{-1} e^{j\omega t} \quad (13)$$

Equation (13) yields the power amplitude of:

$$\Pi = \left| \frac{v^2(t)}{R_l} \right| = \frac{\omega^2 A_e^2 d_{33}^2 P_0^2 R_l}{1 + \omega^2 R_l^2 C_p^2} \quad (14)$$

Accordingly, Equation (14) yields:

$$\left. \frac{\partial \Pi}{\partial R_l} \right|_{R_l = R_l^{opt}} = 0 \rightarrow R_l^{opt} = \frac{1}{\omega C_p} = \frac{(\phi_o - \phi_i)}{\omega \varepsilon_{33}^T \pi (\phi_o + \phi_i) L} \quad (15)$$

The AC power amplitude for the optimal load is given by:

$$\Pi_{max} = \Pi \big|_{R_l = R_l^{opt}} = \frac{\omega A_e^2 d_{33}^2 P_0^2}{2 C_p} = \frac{\omega d_{33}^2 \pi (\phi_o^2 - \phi_i^2) L P_0^2}{8 \varepsilon_{33}^T} \quad (16)$$

The frequency-normalized maximum power output, therefore, is:

$$\alpha = \frac{\Pi_{max}}{f} = \frac{\pi^2 d_{33}^2}{4 \varepsilon_{33}^T} (\phi_o^2 - \phi_i^2) L P_0^2 = \frac{\pi d_{33}^2}{\varepsilon_{33}^T} V_p P_0^2 \quad (17)$$

As discussed above, Equation (17) may be rearranged to express the volume needed to obtain a specific normalized power output for a given application:

$$V_p = \alpha \frac{\varepsilon_{33}^T}{\pi P_0^2 d_{33}^2} \qquad (18)$$

As will be understood and appreciated, the maximum power output expressions given by Equations (8) and (17) are identical, as are the equations for the required volumes of material, i.e., Equations (9) and (18). It is, however, important to recognize that the matched load resistance values due to Equations (6) and (15) are different as the capacitance values for the two configurations are different.

Material Property Modeling of Shunted Piezoelectric Materials

Figure 11A:
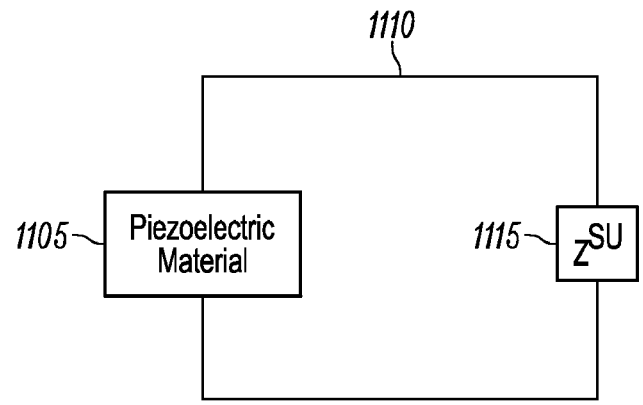
FIG. 11A is a diagram illustrating a piezoelectric material 1105 shunted through an external circuit, according to an exemplary embodiment.
Figure 11B:
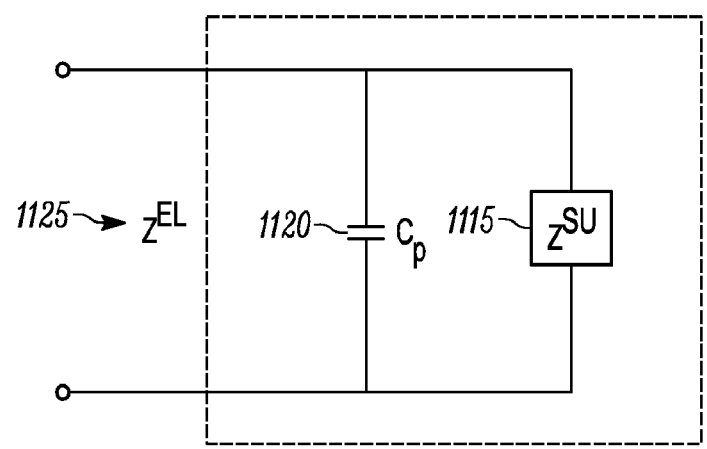
FIG. 11B is a diagram depicting an equivalent circuit model for the combined system shown in FIG. 11A, according to an exemplary embodiment.

As will be understood and appreciated, piezoelectric materials with an attached electric circuit (i.e., regulatory circuitry) are commonly referred to as being "shunted" through the circuit. FIG. 11A illustrates piezoelectric material 1105 shunted through an external circuit 1110 with impudence $Z^{SU}$ 1115, according to one embodiment. FIG. 11B depicts an equivalent circuit model for the combined system shown in FIG. 11A, where the piezoelectric material 1105 is represented as a single capacitance $C_P$ 1120, and the combined impedance of the piezoelectric material and external shunt is given as $Z^{EL}$ 1125, according to one embodiment.

Under uniaxial loading, the frequency-dependent Young's modulus of the piezoelectric material (e.g., 1105) in terms of the shunt's electrical admittance may be given as:

$$E_p^{SU}(\omega) = \frac{E_p^E(j\omega C_p^T + Y^{SU})}{(j\omega C_p^T + Y^{SU}) - j\omega k_{33}^2 C_p^T} = E_p^E \frac{j\omega C_p^T + Y^{SU}}{j\omega C_p^T(1 - k_{33}^2) + Y^{SU}} \qquad (19)$$

Equation (19) can yield complex values for the elastic modulus of the shunted material, with the interpretation that the imaginary part is the effective damping and the real part is the effective stiffness. This may be also expressed as:

$$E_p^{SU} = E_d + jE_l \qquad (20)$$

In Equation 20, $E_d$ is the dynamic modulus (stiffness) and $E_l$ is the loss modulus. The explicit frequency dependency of the terms in Equation 20 has been suppressed for notational compactness. Accordingly, it may be convenient to express the complex modulus as:

$$E_P^{SU} = E_p^E(\kappa + j\mu) \qquad (21)$$

As will be understood, the admittance of the shunt circuit, $Y^{SU}$ is the inverse of its impedance, $Y^{SU} = 1/Z^{SU}$. As will be further understood, in general, the impedance of a real circuit component may be modeled as having resistive, inductive, and capacitive elements in series such that:

$$Z = R + j\left(\omega L - \frac{1}{\omega C}\right) \qquad (22)$$

As shown in Equation (22), R is the resistance, L the inductance, and C the capacitance. Because of the frequency-dependency inherent in Equation (19), the shunted piezoelectric exhibits frequency-dependent behavior because of the shunt in addition to any inherent frequency-dependent behavior of the piezoelectric material itself. Further, if the shunt includes an inductor, the shunt introduces an additional degree of freedom to the system dynamics, permitting the use of a shunt as an electromechanically coupled tuned vibration absorber or damper. Shunts comprised solely of capacitors and resistors only impact the stiffness and damping, respectively, and do not add additional degrees of freedom to the system.

For a purely resistive shunt, the shunt impedance may be given as:

$$Z^{SU} = R \qquad (23)$$

which yields an effective Young's modulus of:

$$E_p^{SU}(\omega) = E_p^E \frac{j\omega C_p^T + R^{-1}}{j\omega C_p^T(1 - k_{33}^2) + R^{-1}} = E_p^E \frac{j\omega RC_p^T + 1}{j\omega RC_p^T(1 - k_{33}^2) + 1} \qquad (24)$$

For typical values of $C_p$, R, and $\omega$, which are relevant to HPEH devices (e.g., HPEH 400), Equation (24) suggests that a resistive load (i.e., shunt) will only have a minor impact on the real and imaginary components of the Young's modulus of the piezoelectric.

In certain configurations, a shunt may comprise an inductor and resistor in series, in which case the shunt impedance is given by:

$$Z^{SU} = R + j\omega L \qquad (25)$$

which yields an effective Young's modulus of:

$$E_p^{SU}(\omega) = \qquad (26)$$

$$E_p^E \frac{j\omega C_p^T + (R + j\omega L)^{-1}}{j\omega C_p^T(1 - k_{33}^2) + (R + j\omega L)^{-1}} = E_p^E \frac{j\omega(R + j\omega L)C_p^T + 1}{j\omega(R + j\omega L)C_p^T(1 - k_{33}^2) + 1}$$

In certain conditions pertaining to the frequency $\omega_0$, the inductance and capacitance cancel:

$$\omega_o C_p - \frac{1}{\omega_o L_l} = 0 \qquad (27)$$

At this particular frequency, the effective Young's modulus is given by:

$$E_p^{SU}(\omega_o) = \qquad (28)$$

$$E_p^E \frac{j\omega_o RC_p^T}{(j\omega_o RC_p^T - 1)(1 - k_{33}^2) + 1} = E_p^E \frac{j\omega_o RC_p^T}{j\omega_o RC_p^T(1 - k_{33}^2) + k_{33}^2}$$

At this particular "tuned" frequency, and for typical values of $C_p$ and R, as are relevant to HPEH devices (e.g., HPEH 400), Equation 28 suggests that that a tuned resistive-inductive load (i.e., shunt) will have a dramatic impact on the real and imaginary components of the Young's modulus of the piezoelectric, meaning the real part (stiffness) may be reduced by orders of magnitude, and the imaginary part (damping) increased.

In other configurations, a shunt may comprise an inductor and resistor in parallel. According, the shunt impedance and admittance may be found by:

$$\frac{1}{Z^{SU}} = \frac{1}{R} + \frac{1}{j\omega L} = \frac{R + j\omega L}{j\omega RL} = Y^{SU} \qquad (29)$$

According, the Young's modulus is given by:

$$E_p^{SU}(\omega) = \qquad (30)$$

$$E_p^E \frac{j\omega C_p^T + \frac{R+j\omega L}{j\omega RL}}{j\omega C_p^T(1-k_{33}^2) + \frac{R+j\omega L}{j\omega RL}} = E_p^E \frac{-\omega^2 RLC_p^T + R + j\omega L}{-\omega^2 RLC_p^T(1-k_{33}^2) + R + j\omega L}$$

As discussed above, in certain conditions pertaining to the frequency $\omega_o$, the inductance and capacitance cancel, which eliminates the reactive component of the impedance, for which:

$$\omega_o C_p - \frac{1}{\omega_o L_t} = 0 \qquad (31)$$

At this particular frequency, the effective Young's modulus may be given by:

$$E_p^{SU}(\omega_o) = E_p^E \frac{1}{1 - j\frac{Rk_{33}^2}{\omega_o L_t}} = E_p^E \frac{1}{1 - j\omega_o C_p R k_{33}^2} \qquad (32)$$

At this "tuned" frequency, and for typical values of $C_p$, and R, as are relevant to HPEH devices (e.g., HPEH 400), Equation (32) suggests that a tuned parallel resistive-inductive load (i.e., shunt) will have little impact on the real and imaginary components of the Young's modulus of the piezoelectric.

Modeling of Power Output from Shunted Piezoelectric Material

When an appropriately aligned stress is applied to a piezoelectric material, a voltage is generated between its electroded faces. The magnitude of that voltage generally depends on the shunt circuit (or absence thereof) attached to the piezoelectric. The generated voltage and its associated current flowing through a suitable shunt represents a power source. Accordingly, modeling the power production from piezoelectric materials involves relating the generated currents and voltages to the applied mechanical stress. Therefore, analysis of voltage response and power output of piezoelectric materials connected to shunts will be discussed below. Later, these developments will be repeated for the specific application of multi-layer piezoelectric stacks.

The voltage appearing across the electrodes of a piezoelectric due to an imposed external current I and time-varying stress T may be given as:

$$v = Z^{EL}I - j\omega Z^{EL} A dT \qquad (33)$$

where $Z^{EL}$ is the combined impedance of the piezoelectric material and the shunt impedance, given by:

$$\frac{1}{Z^{EL}} = \frac{1}{Z^D} + \frac{1}{Z^{SU}} = j\omega C_p^T + \frac{1}{Z^{SU}} \qquad (34)$$

In terms of admittances, $$Y^{EL} = Y^D + Y^{SU} \qquad (35)$$

where $Y^D$ is the open-circuit admittance of the piezoelectric. Note the for HPEH devices (e.g., HPEH 400), there generally is no external imposed current, and the induced stress is due to the applied pressure. Further, Equation (34) assumes that the device impedance, $Z^D$, has only capacitive impedance. Piezoelectric devices often experience frequency-dependent resistance, and Equation (34) would need to be revised to account for such impedance components. This revision would only be necessary, for example, if performance analyses based on the model represented by Equation (34) are not sufficiently accurate as compared to measured performance.

Generally, an HPEH device such as HPEH 400 utilizes uniaxial loading parallel to the polarization axis. In such scenarios, Equation (33) reduces to:

$$v = Z^{EL}i - j\omega Z_{EL} A d_{33} \sigma_{33} \qquad (36)$$

In the absence of an external imposed current (i.e., i=0), and relating stress to an applied time-harmonic force represented in complex harmonic form as:

$$F(\omega, t) = F_0 e^{i\omega t} \qquad (37)$$

in which case the generated voltage is given by:

$$v = -j\omega Z^{EL} d_{33} F = -Z^{EL} d_{33} \dot{F} \qquad (38)$$

With the complex representation of the force as well as complex impedance $Z^{EL}$, the voltage response of Equation (38) is likewise complex. As will be understood, only the real parts of these expressions are physically observable. Accordingly, it is generally preferable to utilize the real parts in computations.

Equation (38) represents the equivalent voltage source in a passive circuit including the piezoelectric material and a shunt, according to one embodiment. Often, it is easier to use Kirchoff's Current Law to analyze simple circuits used as shunts, and it can be used to find the current-source equivalent of Equation (38) through a simple application of Ohm's law, which yields:

$$i = \frac{v}{Z^{EL}} = -j\omega d_{33} F = -d_{33} \dot{F}. \qquad (39)$$

Figure 12A:
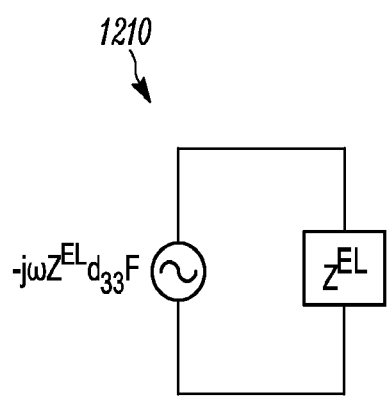
FIG. 12A is a diagram representing a voltage-source model 1210 for piezoelectric material exposed to force, according to an exemplary embodiment.
Figure 12B:
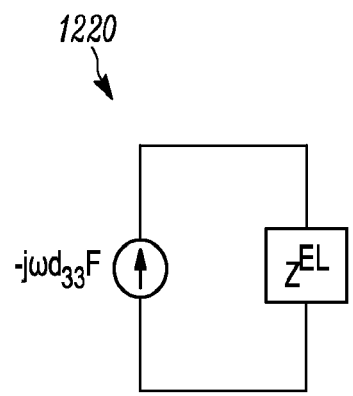
FIG. 12B is a diagram representing a current-source model 1220 for piezoelectric material exposed to force, according to an exemplary embodiment.

It is important to note that the negative signs in Equations (38) and (39) follow from the sign convention used for piezoelectrics in which as a positive or tensile force leads to a positive or tensile stress and a positive voltage. But, a positive stress in the solid corresponds to negative pressures in an applied fluid, such that when pressure is introduced in place of force, these equations become:

$$v = j\omega Z^{EL} d_{33} AP = Z^{EL} d_{33} \dot{P} \qquad (40)$$

and, $$i = \frac{v}{Z^{EL}} = j\omega d_{33} AP = d_{33} A\dot{P} \qquad (41)$$

respectively. FIGS. 12A and 12B represent a voltage-source model 1210 and a current-source model 1220 for piezoelectric material exposed to force, respectively.

Figure 13:
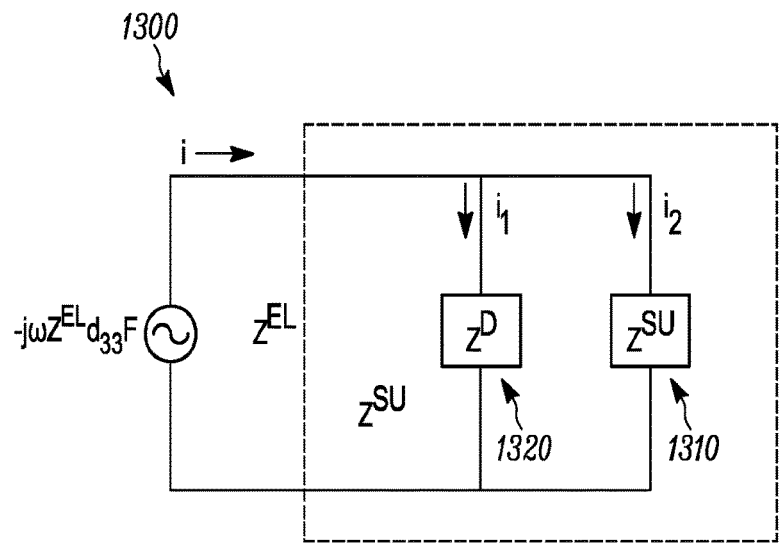
FIG. 13 is a diagram of a model circuit 1300 comprising a shunt 1310 in parallel with a piezoelectric device 130, according to an exemplary embodiment.

FIG. 13 depicts a model circuit 1300 comprising a shunt 1310 with impedance $Z^{SU}$ in parallel with a piezoelectric device 1320 with impedance $Z^D$, which is instructive in considering the power produced from a piezoelectric. As will be understood, the power produced will depend on the specific details of the circuits and discrete impedances that are embodied within these high-level representations. In the following, the term "shunt" must be understood as being the entirety of the circuit attached to the piezoelectric. Further, distinction must be made between the power delivered into the shunt and the power that is actually harvested by some subcomponent of the shunt. To explain this latter point, consider that all resistances, of whatever source, in the shunt will consume power (e.g., the parasitic resistance within inductors), and such power is lost and cannot be harvested. Finally, the time-average power delivered to the energy harvesting subcomponent is considered to be significant as opposed to the peak or instantaneous power.

Analysis of Power Dissipated in AC Circuits

What follows is a review of the basic power analysis of time-harmonic electrical circuits, which will be familiar to one of skill in the art. The instantaneous power dissipated in an impedance, where the impedance is represented as:

$$Z = R + jX \quad (42)$$

is simply the product of the real part of the voltage across the impedance and the real part of the current through the impedance, which may be given by:

$$\Pi = v_r i_r \quad (43)$$

where the subscript r implies the real part of the indicated quantity. But, what is typically of interest, particularly for HPEH devices (e.g., HPEH 400), is the average power, which may be obtained by:

$$\Pi_{rms} = v_{rms} i_{rms} \cos\varphi = i_{rms}^2 R = \frac{v_{rms}^2 \cos\varphi}{|Z|} \quad (44)$$

where the subscript rms indicates the root-mean-square average, and $\varphi$ is the phase angle between the voltage and current. The rms values of the current and voltage are given by:

$$v_{rms} = \frac{V_p}{\sqrt{2}} \quad (45)$$

and $$i_{rms} = \frac{I_p}{\sqrt{2}} \quad (46)$$

accordingly. As shown in Equation (45), $V_p$ represents the peak voltage, and in Equation (46), $I_p$ represents the peak current, respectively. Typically, these are the amplitudes of the sinusoidal or complex representations for the voltage and current. The expression cos $\varphi$ in the equation for average (i.e., rms power) as given by Equation (44), is known as the power factor. The power factor is expressed in terms of the element of the impedance as:

$$\cos\varphi = \frac{R}{\sqrt{R^2 + X^2}} \quad (47)$$

Using Equation (47) for the power factor allows the rms power to be expressed as:

$$\Pi_{rms} = v_{rms} i_{rms} \frac{R}{\sqrt{R^2 + X^2}} = i_{rms}^2 R = \frac{v_{rms}^2 R}{|Z|^2} \quad (48)$$

Application of the equations developed above involves identifying the appropriate expressions for voltage, current, and impedance relevant to a given circuit architecture, or subcomponent, within a circuit. Additionally, it involves selection of an appropriate form of the equation to be used based on the ease of applying an equation's given form to the particular details of a circuit.

Power Dissipated in Arbitrary Shunts

In light of the above review of the average power dissipated in circuits, and considering FIG. 13, the average power delivered into a shunt is dependent on the voltage across the shunt, the current i that goes into the shunt, and the impedance of the shunt. With respect to the applicable labeled parameters in FIG. 13, the average power may be expressed as:

$$\Pi_{rms} = v_{rms} i_{2,rms} = \frac{v_{rms}^2}{|Z^{SU}|^2} \mathrm{Re}(Z^{SU}) \quad (49)$$

which, in consideration of Equation (38), may be expressed as:

$$\Pi_{rms} = \frac{\omega^2 |Z^{EL}|^2 d_{33}^2 F_0^2}{2|Z^{SU}|^2} \mathrm{Re}(Z^{SU}) \quad (50)$$

Equation (50) yields the total power dissipated into the shunt. As previously noted, this power might not be the power captured by the energy harvester subcomponent, which appears as some form of resistance load, if the shunt includes resistive elements in addition to the energy-harvesting load. In Equation (50), the factor 2 in the denominator follows from the expression for the rms voltage. Further, Equation (50) assumes that $F_0$ represents the amplitude of the applied force, not its rms value.

Power Dissipated in Arbitrary Shunts with Energy Harvester

Figure 14:
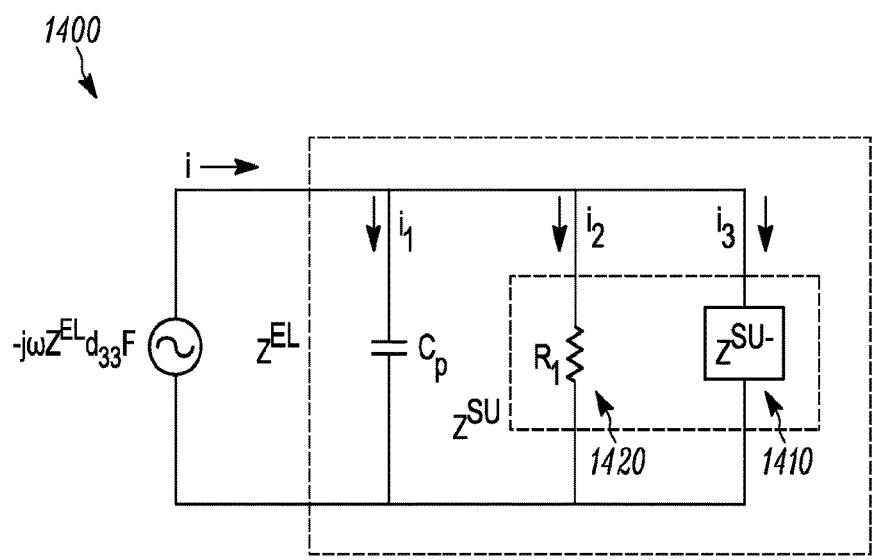
FIG. 14 is a diagram of a model circuit 1400 comprising an energy harvester component in parallel with an impedance, according to an exemplary embodiment.

In example embodiments, a shunt may contain resistances in addition to that of an energy harvesting subcomponent. Accordingly, it may be useful to recast the model circuits considered above as circuit components in parallel. For example, a circuit may be modeled such that a resistance representing the energy harvester subcomponent is in parallel with the rest of the circuit elements, including the piezoelectric, which are collectively lumped into another element. Essentially, this example model configuration implies decomposing the shunt impedance into an energy harvester component in parallel with an impedance that captures all other components, which is shown in FIG. 14. FIG. 14 illustrates a model circuit 1400 where the impedance $Z^{SU-}$ 1410 represents the impedance of the shunt excepting the impedance of the energy harvesting load impedance, which is represented as $R_l$ 1420. As will be understood, as long as parasitic losses down the branch with $R_l$ are small compared to $R_l$ 1420, then they may be neglected for modeling.

For the model circuit 1400, the generic power expression is given as:

$$\Pi_{rms} = v_{rms} i_{2,rms} \tag{51}$$

Accordingly, the current into the load resistance is found by:

$$i_2 = \frac{v}{R_l} \tag{52}$$

in which case the average power is given as:

$$\Pi_{rms,l} = \frac{v_{rms}^2}{R_l} = \frac{\omega^2 |Z^{EL}|^2 d_{33}^2 F_0^2}{2R_l} \tag{53}$$

Note that based on this model circuit 1400, so long as the voltage that is induced across the piezoelectric 1410 is the same as that induced across the energy harvester load 1420, then the simple expression of Equation (53) applies.

Equations (53) and (49) allow for the construction of a efficiency metric that expresses what fraction of the power delivered into a shut is actually captured by an energy harvesting component (e.g., 1420). Accordingly, a shunt efficiency can be given as the ratio of Equations (53) and (49) as follows:

$$\eta_{SU} = \frac{|Z^{SU}|^2}{R_l \text{Re}(Z^{SU})} \tag{54}$$

Power Dissipated in Resistive-Only Shunt

Figure 15:
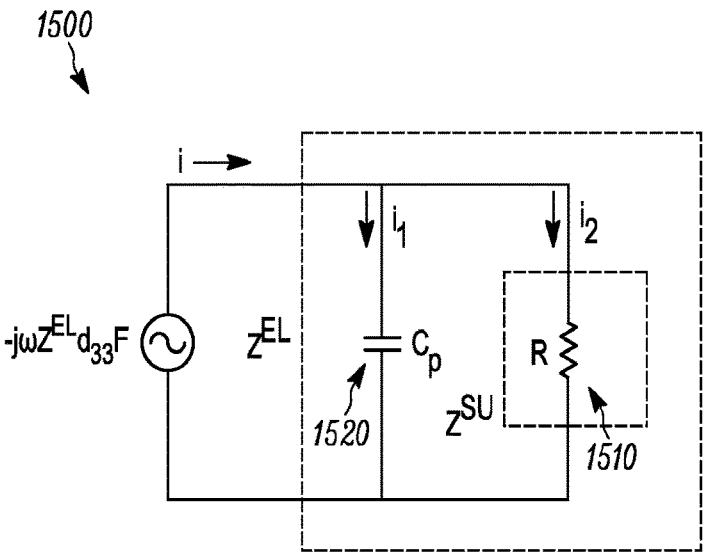
FIG. 15 is a diagram of a model circuit 1500 comprising an ideal resistor 1510 in parallel with an ideal resistor 1520, according to an exemplary embodiment.

It is likewise possible to model a shunt as an ideal resistor in parallel with a piezoelectric modeled as an ideal capacitor, as is shown in FIG. 15. As shown in the model circuit 1500, an ideal resistor 1510, which represents a shunt, is in parallel with an ideal capacitor 1520, which represents a piezoelectric. The configuration 1500 conforms to the structure developed above for arbitrary shunts such that Equation (50) applies. As will be understood, identifying the impedance expressions appropriate for use in Equation (50) requires:

$$\text{Re}(Z^{SU}) = R \tag{55}$$

and:

$$|Z^{EL}|^2 = \frac{R^2}{1 + \omega^2 C_p^2 R^2} \tag{56}$$

Using Equations (55) and (56), Equation (50) can be modified to:

$$\Pi_{rms} = \frac{R^2}{1 + \omega^2 C_p^2 R^2} \frac{\omega^2 d_{33}^2 F_0^2}{2R^2} R = \frac{1}{2} \frac{\omega^2 d_{33}^2 F_0^2 R}{1 + \omega^2 C_p^2 R^2} \tag{57}$$

Alternatively, it is possible to modify Equation (53) such that:

$$\Pi_{rms,l} = \frac{v_{rms}^2}{2R_l} = \frac{\omega^2 |Z^{EL}|^2 d_{33}^2 F_0^2}{2R_l} = |Z^{EL}|^2 = \frac{1}{2} \frac{\omega^2 d_{33}^2 F_0^2 R_l}{1 + \omega^2 C_p^2 R_l^2} \tag{58}$$

As shown, Equations (57) and (58) are identical, as they must be. Further, it is significant to note that the shunt efficiency given in Equation (54) is equal to one, as it must be in the case of the ideal model circuit 1500.

Power Dissipated in Resistive-Inductive Shunt

Figure 16:
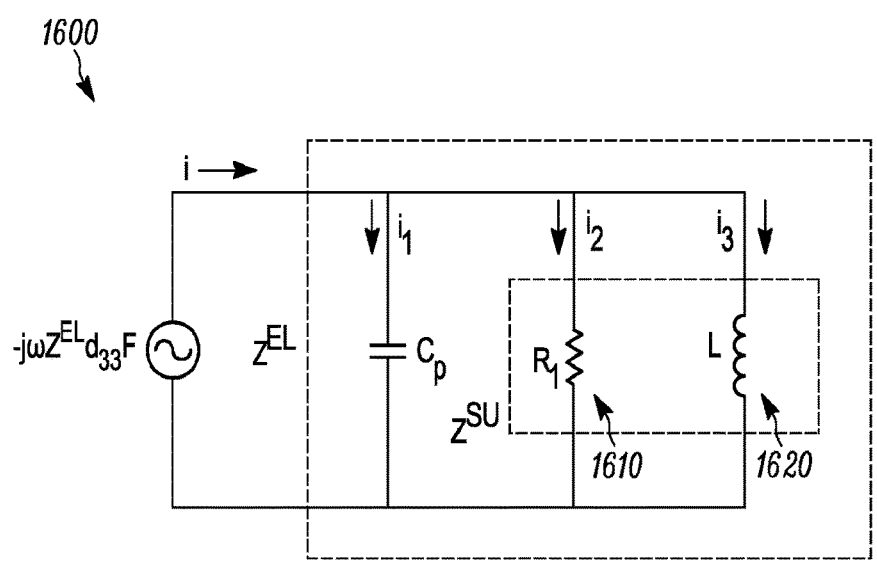
FIG. 16 is a diagram of a model circuit 1600 for power analysis of an ideal piezoelectric element shunted with an ideal resistor 1610 and an ideal inductor 1620, according to an exemplary embodiment.

FIG. 16 shows a model circuit 1600 for power analysis of an ideal piezoelectric element shunted with an ideal resistor 1610 and an ideal inductor 1620. When the shunt is modeled as the ideal parallel resistor-inductor circuit 1600, as shown in FIG. 16, then the general power expression of Equation (50) is applicable. Accordingly, the impedances necessary for utilizing Equation (50) may be derived as follows:

$$Z^{SU} = \frac{j\omega RL}{R + j\omega L} \tag{59}$$

such that:

$$\text{Re}(Z^{SU}) = \frac{\omega^2 RL^2}{R^2 + \omega^2 L^2} \tag{60}$$

Accordingly:

$$|Z^{SU}|^2 = \frac{\omega^2 R^2 L^2}{R^2 + \omega^2 L^2} \tag{61}$$

Further:

$$Z^{EL} = \frac{j\omega RL}{R - \omega^2 LRC_p + j\omega L} \tag{62}$$

Accordingly:

$$|Z^{EL}|^2 = \frac{\omega^2 R^2 L^2}{(R - \omega^2 LRC_p)^2 + \omega^2 L^2} \tag{63}$$

Therefore, the expression for the average power delivered into the shunt in model circuit 1600 is given as:

$$\Pi_{rms} = \frac{d_{33}^2 F_0^2}{2} \frac{\omega^4 RL^2}{(R - \omega^2 LRC_p)^2 + \omega^2 L^2} \tag{64}$$

Alternative forms of the power expression shown in Equation (64) may also be useful, including:

$$\Pi_{rms} = \frac{\omega^2 d_{33}^2 F_0^2}{2R} \left| \frac{j\omega RL}{R + j\omega L + j\omega C_p(j\omega RL)} \right|^2 \tag{65}$$

and:

$$\Pi_{rms} = \frac{\omega^2 d_{33}^2 F_0^2}{2R} \frac{1}{\left|\frac{1}{R} - \frac{j}{\omega L} + j\omega C_p\right|^2} \quad (66)$$

which yields:

$$\Pi_{rms} = \frac{\omega^2 d_{33}^2 F_0^2 R}{2\left|1 + jR\left(\omega C_p - \frac{1}{\omega L}\right)\right|^2} \quad (67)$$

Accordingly, using Equation (53) to determine average power yields:

$$\Pi_{rms,l} = \frac{v_{rms}^2}{R_l} = \frac{d_{33}^2 F_0^2}{2} \frac{\omega^4 R_l L^2}{(R_l - \omega^2 L R_l C_p)^2 + \omega^2 L^2} \quad (68)$$

which matches Equation (64), as it must.

Assuming ideal RLC circuit elements in parallel, as is shown in FIG. 16, Equations (38) and (49) may be combined to yield:

$$\Pi_{rms} = \omega^2 d_{33}^2 F_0^2 \frac{|Z^{EL}|^2}{2R} = \frac{\omega^2 d_{33}^2 F_0^2}{2R} \frac{|Z^{SU}|^2}{|1 + j\omega C_p Z^{SU}|^2} \quad (69)$$

If the shunt itself is an ideal parallel RL circuit, then:

$$Z^{SU} = \frac{j\omega RL}{R + j\omega L} \quad (70)$$

Accordingly, Equation (69) can be rewritten as:

$$\Pi_{rms} = \frac{\omega^2 d_{33}^2 F_0^2}{2R} \left|\frac{j\omega RL}{R + j\omega L + j\omega C_p(j\omega RL)}\right|^2 \quad (71)$$

where Equation (71) has been left in its unreduced form to facilitate the following inductive tuning example.

Inductive Tuning of a Resistive-Inductive Shunt

As discussed, Equation (65) represents an expression for the power dissipated in a resistive-inductive shunt. It is possible to tune a circuit such that the condition:

$$\omega_o L = \frac{1}{\omega_o C_p} \quad (72)$$

is true at a particular target tuning frequency, $\omega_0$. Under such a condition, Equation (65) reduces to:

$$\Pi(\omega_o) = \frac{\omega_o^2 d_{33}^2 F_0^2 R}{2} \quad (73)$$

In the context of HPEH devices (e.g., HPEH 400), this may be termed "inductive tuning" since the capacitance of the device is fixed such that the size of an inductor must be intelligently selected to impose the condition of Equation (72). It is important to note that Equation (73) implies that the power output may be made arbitrarily large simply through making the value of R arbitrarily large. But, as the input work is finite and bounded, the output power can't be arbitrarily large, as will be understood by one of skill in the art.

Further, the condition implied by Equation (72) is actually the resonance frequency of a parallel RLC circuit (e.g., 1600):

$$\omega_o = \frac{1}{\sqrt{LC_p}} \quad (74)$$

With respect to standard circuit parameters, attenuation is given by:

$$\alpha = \frac{1}{2RC_p} \quad (75)$$

Further, the damping factor is given by:

$$\varsigma = \frac{1}{2R}\sqrt{\frac{L}{C_p}} \quad (76)$$

Finally, the quality factor is given by:

$$Q = R\sqrt{\frac{C_p}{L}} \quad (77)$$

Curiously, Equations (75)-(77) suggest that increasing resistance in a model circuit such as model circuit 1600 decreases the damping and increases the quality factor. This is opposite from what would happen for a series RLC circuit. For a series RLC circuit, the resonance frequency is the same as shown in Equation (74); however, the damping and quality parameters are given as follows:

$$\alpha_{series} = \frac{R}{2L} \quad (78)$$

$$\varsigma_{series} = \frac{R}{2}\sqrt{\frac{C}{L}} \quad (79)$$

$$Q_{series} = \frac{1}{R}\sqrt{\frac{L}{C}} \quad (80)$$

For a series RLC circuit, increasing the resistance lowers the quality factor (i.e., reduces the sharpness of resonance).

Power Dissipated in Resistive-Inductive Shunts with Parasitic Resistances

Figure 17:
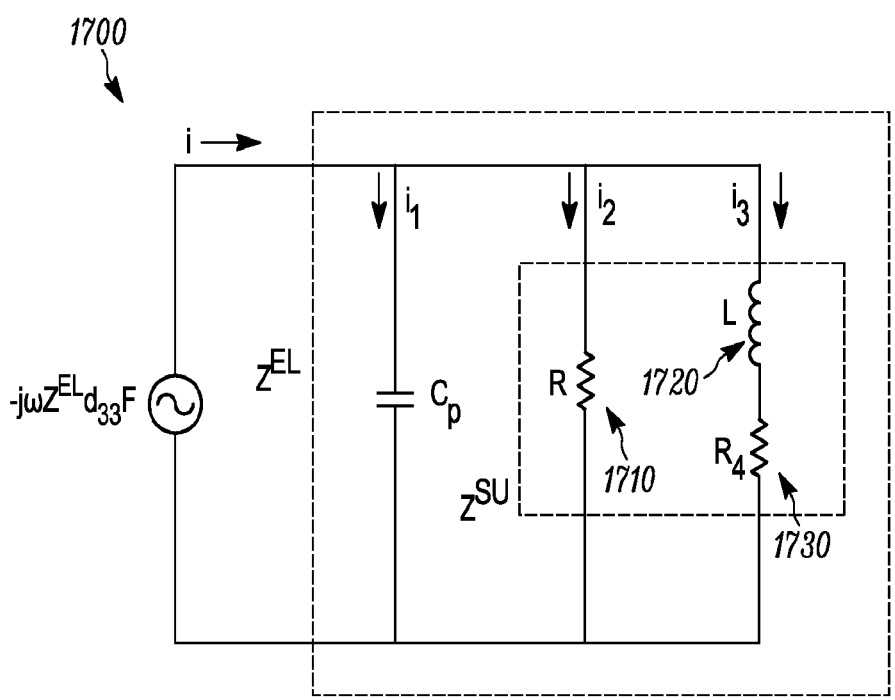
FIG. 17 is a diagram of a model circuit 1700 for power analysis of an ideal piezoelectric element shunted with an ideal resistor 1710 and an ideal inductor 1720 with resistance 1730 in the inductor 1720, according to an exemplary embodiment.

The circuit models developed in the previous sections represent particular idealizations of real circuits, according to certain embodiments. The following considers a model for an RL shunt circuit that more closely reflects real circuit elements. Specifically, FIG. 17 shows a circuit model 1700 for power analysis of an ideal piezoelectric element shunted with an ideal resistor 1710 and an ideal inductor 1720 with resistance 1730 in the inductor. By including resistance (i.e., 1730) in the inductor leg of the circuit 1700, the model circuit 1700 more similarly reflects a real scenario. As will be understood, real inductors typically possess some finite, albeit small, resistance. This resistance may be significant, though, and it has been found to be necessary to account for in modeling. In contrast to the circuits developed previously, the model circuit 1700 has multiple resistances. The primary focus, however, is the power dissipated in resistor 1710, which is presumed to represent the actual energy-harvesting subcomponent, according to one embodiment. Nonetheless, the form of model circuit 1700 is such that both Equations (50) and (53) may be used, where Equation (50) describes the power delivered into the shunt while the latter describes the power delivered into the energy-harvesting subcomponent. Further, model circuit 1700 generally will have a shunt efficiency less than unity due to the presence of the resistance in the inductive branch of the circuit (i.e., 1730).

Accordingly, the average power can be expressed as:

$$\prod_{rms,l} = \frac{v_{rms}^2}{R_l} = \frac{\omega^2 |Z^{EL}|^2 d_{33}^2 F_0^2}{2R_l} \quad (81)$$

Basic Modeling of Multi-Layer Stacks within HPEH Devices

Figure 18A:
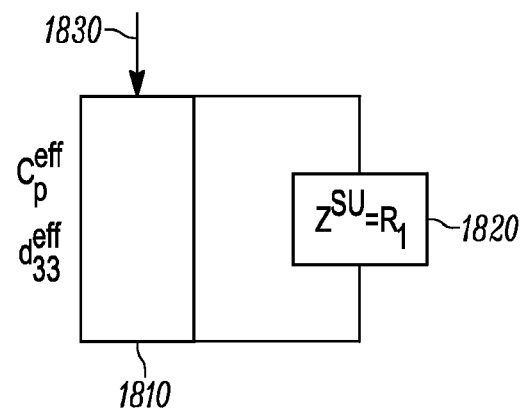
FIG. 18A is a diagram of a multilayer piezoelectric stack 1810 terminated with a resistive load 1820, according to an exemplary embodiment.
Figure 18B:
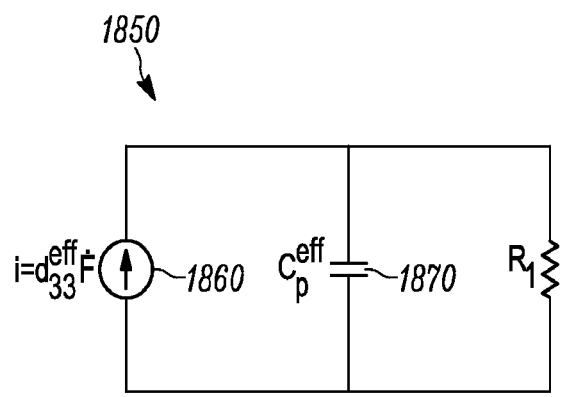
FIG. 18B is a diagram of an electrical model 1850 equivalent to the diagram shown in FIG. 18A in which the piezoelectric stack 1810 is represented as a current source 1860 in parallel with a capacitance 1870, according to an exemplary embodiment.

In example embodiments, an HPEH (e.g., HPEH 400) may be configured using a multi-layer piezoelectric stack (e.g., piezo stack 430) as the active element, which may be terminated with a resistive load. As an example, FIG. 18A shows a multilayer piezo stack 1810 terminated with a resistive load 1820. FIG. 18B shows an electrical equivalent model 1850 in which the piezo stack 1810 is represented as a current source 1860 in parallel with a capacitance 1870.

According to one embodiment and as shown in the FIG. 18A, each layer within the piezo stack 1810 may have a $d_{33}^i$ coefficient, which is assumed to be the same for each layer of the piezo stack 1810. Further, the capacitance in the piezo stack 1810, $C_p^i$, is assumed to be the same for each layer, in one embodiment. If the piezo stack 1810 has N layers in parallel, all subjected to the same force 1830, which may be given as $F=PA_{eff}$, then the effective $d_{33}$ of the stack may be expressed as:

$$d_{33}^{eff} = N d_{33}^i \quad (82)$$

and:

$$C_p^{eff} = N C_p^i \quad (83)$$

where each layer is assumed to be identical, according to one embodiment. Assuming bulk values for the capacitance and $d_{33}$ leads to:

$$C_p^i = \frac{\varepsilon_{33}^T A}{h} \quad (84)$$

where A is the cross-sectional area of each layer of the piezo stack 1810 and h is the thickness of each layer. The governing equation for the equivalent circuit may then be given as:

$$N \frac{\varepsilon_{33}^T A}{h} \dot{v} + \frac{1}{R_l} v = N d_{33}^i \dot{F} \quad (85)$$

or:

$$C_p^{eff} \dot{v} + \frac{1}{R_l} v = d_{33}^{eff} \dot{F} \quad (86)$$

where v is the induced voltage. If the disturbance input (i.e., the force 1830) is represented as a harmonic function:

$$F(t,\omega) = F_0 e^{j\omega t} \quad (87)$$

Accordingly, the voltage response may also be a harmonic function:

$$v(t,\omega) = V_0 e^{j\omega t} \quad (88)$$

Upon substituting Equations (87) and (88) into Equation (85) and solving for the ratio between the force input (e.g., 1830) and the voltage response (i.e., the voltage frequency response function), it is possible to obtain:

$$\alpha(\omega) = \frac{V_0}{F_0} = \frac{j\omega d_{33}^{eff}}{j\omega C_p^{eff} + R_l^{-1}} \quad (89)$$

In the foregoing, the shunt conforms to the configuration considered previously such that rms power is given as:

$$\prod_{rms} = \frac{1}{2} \left| \frac{V_0^2}{R_l} \right| = \frac{1}{2} \frac{R_l}{1 + (\omega R_l C_p^{eff})^2} (\omega d_{33}^{eff} F_0)^2 \quad (90)$$

FIG. 18B shows an electrical equivalent model 1850 in which the piezo stack 1810 is represented as a current source 1860 in parallel with a capacitance 1870.

Maximum Power Output of Multilayer Piezo Stacks with Resistive Shunts

The maximum power output of a multilayer piezo stack (e.g., 1810) may be obtained for the load resistance that maximizes Equation (90), which may be found be setting:

$$\frac{\partial \Pi_{rms}}{\partial R_l} = 0 \quad (91)$$

Accordingly, the optimal load resistance for maximum average power delivered into the resistor may be given as:

$$R_l^{opt} = \frac{1}{\omega C_p^{eff}} \quad (92)$$

Using the optimal load resistance given by Equation (103), the maximum power output can be given as either:

$$\prod_{rms,max} = \prod |_{R_l=R_l^{opt}} = \frac{\omega\left(d_{33}^{eff}F_0\right)^2}{4C_p^{eff}} \quad (93)$$

or:

$$\prod_{rms,max} = \frac{\omega N d_{33}^2 F_0^2}{4\frac{\varepsilon_{33}^T A}{h}} = \frac{\omega N h d_{33}^2 F_0^2}{4\varepsilon_{33}^T A} \quad (94)$$

As shown in Equations (93) and (94), $d_{33}$ represents the piezoelectric strain constant for a single layer of the multilayer piezo stack (e.g., 1810). With an applied force amplitude that is equal to the applied pressure times the effective area, or where $F_0=P_0 A$, then:

$$\Pi_{rms,max} = \frac{\omega(NhA)P_0^2}{4}\frac{d_{33}^2}{\varepsilon_{33}^T} = \frac{\omega V P_0^2}{4}\frac{d_{33}^2}{\varepsilon_{33}^T} \quad (95)$$

where V is the volume of the active layers of the piezo stack.

Inductive Suppression of Reactance for Stacks

Figure 19A:
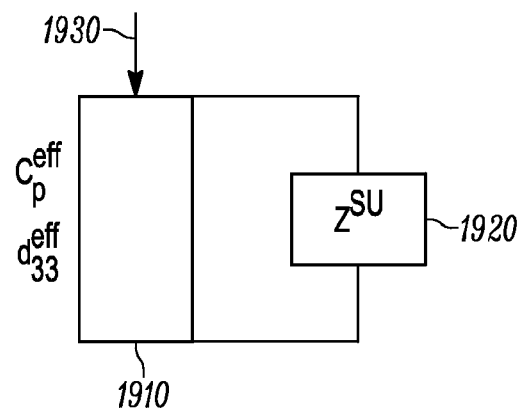
FIG. 19A is a diagram of a piezoelectric stack 1910 terminated with a load impedance 1920, according to an exemplary embodiment.
Figure 19B:
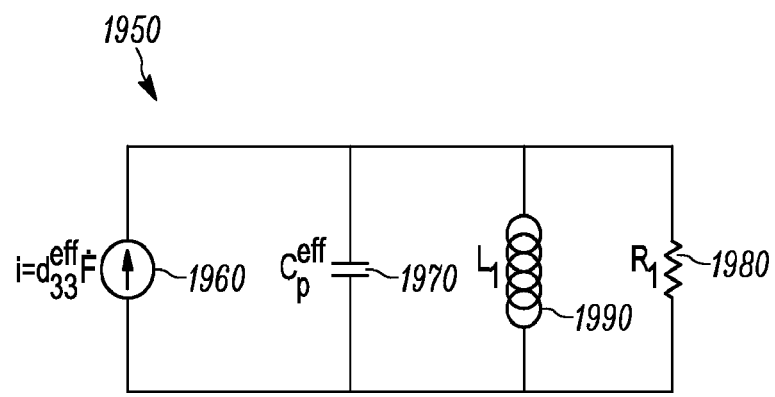
FIG. 19B is a diagram of an electrical model 1950 equivalent to the diagram shown in FIG. 19A in which the piezoelectric stack 1910 is represented as a current source 1960 in parallel with a capacitance 1970, an impedance 1980, and an inductance 1990, according to an exemplary embodiment.

The electromechanical model of the power produced by the piezoelectric stack (e.g., 1810) can be modified to incorporate a parallel resistive-inductive circuit as well as the area of the system. FIG. 19A shows a multilayer piezo stack 1910 terminated with a load impedance 1920. Further, FIG. 19A shows that the piezo stack 1910 is subject to a pressure force 1930 given as $F=PA_{eff}$, according to one embodiment. FIG. 19B shows an equivalent circuit 1950 with the piezo stack 1910 modeled as a current source 1960 in parallel with a capacitance 1970. Further, the equivalent circuit 1950 includes a load impedance 1980 as an additional resistance as well as an inductance 1990, according to one embodiment.

In one embodiment, the governing equation of FIGS. 19A and 19B may be given as:

$$C_p^{eff}\dot{v} + \frac{1}{R_l}v + \frac{1}{L_l}v = d_{33}^{eff}\ddot{F} \quad (96)$$

With substitutions for harmonic forcing and voltage response, as were shown at Equations (87) and (88), it is possible to obtain the following:

$$\left(-\omega^2 C_p^{eff} + j\omega\frac{1}{R_l} + \frac{1}{L_l}\right)V_0 = -\omega^2 d_{33}^{eff}F_0 \quad (97)$$

Accordingly, the frequency response function for this configuration may be given as:

$$\alpha(\omega) = \frac{v(t)}{F_0 e^{j\omega t}} = \frac{v(t)}{P_0 A^{eff} e^{j\omega t}} = j\omega d_{33}^{eff}\left(j\left[\omega C_p - \frac{1}{\omega L_l}\right] + \frac{1}{R_l}\right)^{-1} \quad (98)$$

where $d_{33}^{eff}$ is the effective piezoelectric strain constant for the entire stack, $C_p$ is the piezoelectric stack capacitance, $P_0$ is the dynamic pressure amplitude, and $A^{eff}$ is the effective area designed into the fluid-mechanical coupling of the device interface.

In one embodiment, the load inductance may be chosen (i.e., tuned) such that the imaginary component of the denominator of Equation (98) is identically zero at a particular frequency $\omega_0$. As will be understood by one of skill in the art, this is the tuned inductance condition which suppresses the reactance of the circuit. Accordingly, the expression for the voltage response transfer function may be given as:

$$\alpha(\omega_0) = \frac{V_0}{F_0} = \frac{V_0}{P_0 A^{eff}} = j\omega_o d_{33}^{eff} R_l \quad (99)$$

Equation (99) yields a clear non-physical limitation as solving for the voltage amplitude yields:

$$|V_0| = \omega_o d_{33}^{eff} R_l P_0 A^{eff} \quad (100)$$

Equation (100) implies that the voltage may be made arbitrarily large by making the load resistance $R_l$ arbitrarily large, which leads to a prediction of an arbitrarily large power output. Making use of Equation (100), the real power dissipated in the resistive component of the load at the tuned frequency can be given as:

$$\Pi_{rms} = \frac{1}{2}\left|\frac{V_0^2}{R_l}\right| = \frac{1}{2}R_l\left(\omega_o d_{33}^{eff} P_0 A^{eff}\right)^2 \quad (101)$$

Since all the parameters in the parentheses of Equation (101) can be presumed to be constant and independent of $R_l$, Equation (101) implies that the power output can be made arbitrarily large simply through the use of arbitrarily large resistance. As will be understood, this cannot be true as it violates conservation of energy considerations. Because the physical parameters of the piezo stack are a function of the load impedance, the work input is fixed for a given set of parameters. With fixed work input, the maximum power extracted must be less than or equal to the work input, and cannot be arbitrarily large, as will be understood.

Force Amplification (Area Ratio)

In hydraulic systems, it is possible to exploit different areas exposed to hydraulic pressure to achieve force amplification. For example, an HPEH (e.g., HPEH 400) may be configured such that the cross section of the piezo stack (e.g., 430) has a cross section of $A_{stack}$, while the effective area in contact with the hydraulic fluid is given as $A_{eff}$. The area ratio may be given as:

$$\gamma = \frac{A_{eff}}{A_{stack}} \quad (102)$$

Accordingly, if the HPEH (e.g., HPEH 400) is exposed to pressure P, the force on the piezo stack may be given as:

$$F = \frac{A_{eff}}{A_{stack}}A_{stack}P = \gamma A_{stack}P \quad (103)$$

Generally, for the force amplification to be effective, the area ratio γ should be greater than one. Area ratios less than one may be used as a means to limit the maximum stress applied to the piezoelectric stack in high-pressure applications, according to one embodiment.

In certain embodiments, $A_{eff}$ may not be the area of the HPEH (e.g., HPEH 400) that is exposed to fluid. As shown in, for example, FIG. 4, an HPEH may be configured such that there is a diaphragm (e.g., 470) separating the active elements from the hydraulic fluid. The diaphragm (e.g., 470) may have some flexibility (or stiffness) such that a portion of any applied force goes into deflecting the diaphragm and not deflecting the assembly with the piezo stack (e.g., 430). In an example embodiment, the area ratio can be determined from the cross-sectional area of the exposed end of the piezo stack and the cross-sectional area of the stack. This ratio, however, may be considered as a limiting upper bound, as the true effective area of an HPEH typically is less than this bound.

Motion Amplification (Motion Ratio)

Typically, piezoelectric stacks (e.g., 430) are high-force, low-displacement devices. It is not uncommon to employ motion amplification to a piezo stack in which a mechanism is incorporated between a piezo stack and its end effector to increase the displacement of the end effector. Generally, motion amplification results in a reduction in force at the end effector as compared to the force produced by the piezo stack. If $d_{act}$ is the displacement of the portion of an HPEH device in contact with the hydraulic fluid while $d_{stack}$ is the corresponding displacement of the stack, then the motion ratio may be defined as:

$$\beta = \frac{d_{act}}{d_{stack}} \quad (104)$$

Figure 20:
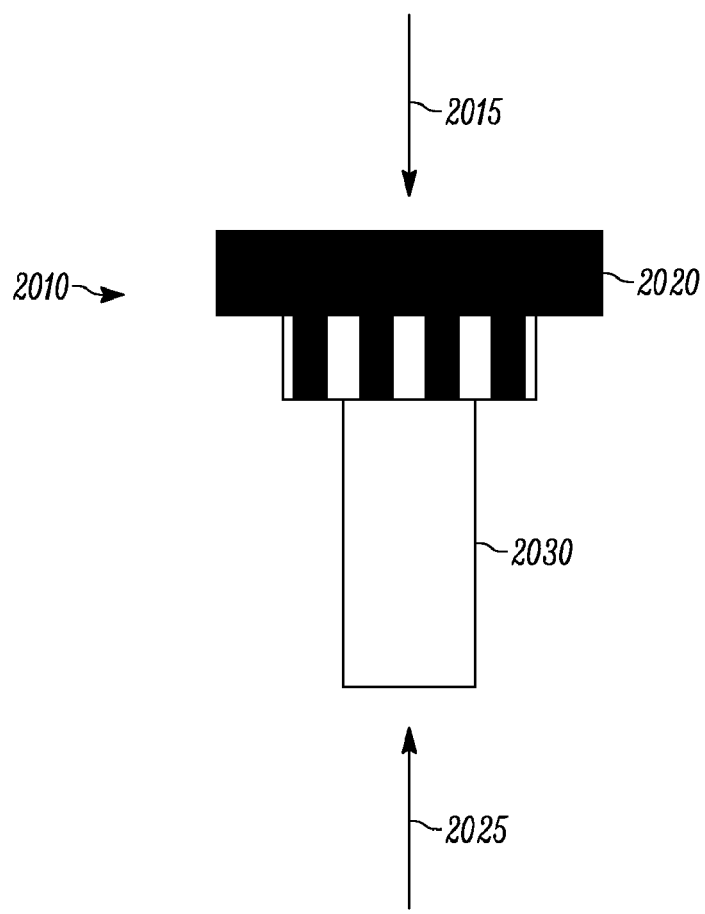
FIG. 20 is an HPEH 2010 configured such that hydraulic pressure 2015 is applied to an effective fluid-contact area 2020, according to an exemplary embodiment.

Applied Pressure and Resulting Force, Stress, Deflection, and Strain in Piezo Stack As shown in FIG. 20, an HPEH 2010 may be configured such that hydraulic pressure 2015 (e.g., pressure ripple characteristics) can be applied to an effective fluid-contact area 2020, which may be designated as $A_{eff}$. In one embodiment, the effective fluid-contact area 2020 may be a surface of a piezoelectric stack. In other embodiments, the effective fluid-contact area 2020 may be an interface comprising two surfaces configured such that one surface is in fluid communication with a pressure ripple and the other surface is in mechanical communication with a surface of a piezoelectric stack. In an example embodiment, it can be assumed that all loads, including the applied pressure 2015 and the force 2025 in the piezo stack 2025 (i.e, $F_{stack}$) are uniaxial and coaxial. According to one embodiment, the HPEH 2010 has an area ratio $\gamma$ and motion ratio $\beta$. By considering the concept of virtual work, as will be understood by one of skill in the art, it is possible to determine the force 2025 resolved onto the piezo stack 2030, which may be characterized as $F_{stack}$, according to one embodiment. The work done in deflecting the effective fluid-contact area 2020 (i.e., $A_{eff}$), which may be assumed to move similar to a piston, through a virtual displacement $\delta'$ is the same as the work done in deflecting the piezo stack 2030 through its corresponding displacement $\delta$. Accordingly:

$$F_{stack}\delta = PA_{eff}\delta' \quad (105)$$

Alternatively, taking advantage of the definition of the motion ratio (i.e., Equation (104) and the area ratio (i.e., Equation (102), yields the following:

$$F_{stack} = \beta PA_{eff} = \beta\gamma PA_{stack} \quad (106)$$

The stress in the piezo stack 2030 is then given as:

$$\sigma_{stack} = \frac{\beta PA_{act}}{A_{stack}} = \beta\gamma P \quad (107)$$

Further, the stress in the piezo stack 2030 may be expressed as:

$$\sigma_{stack} = \frac{E_p^{SU}}{D_o}d = E_p^{SU}\varepsilon \quad (108)$$

where $E_p^{SU}$ is the effective Young's modulus of the shunted piezo stack 2030, $D_0$ is the undeflected length of the piezo stack 2030, and $\varepsilon$ is the strain in the piezo stack 2030 (i.e., $\varepsilon = d/D_o$).

The strain in the piezo stack 2030 for a given applied pressure (i.e., 2015) may be given as:

$$\varepsilon = \frac{\sigma_{stack}}{E_p^{SU}} = \frac{\beta PA_{act}}{A_{stack}E_p^{SU}} = \frac{\beta\gamma P}{E_p^{SU}} \quad (109)$$

The strain equation (i.e., Equation (109)) may then be used to determine the actual strain against the maximum permissible strain for a given stack actuator or material. Accordingly, Equation (109) may be used to express the pressure corresponding to the given strain:

$$P = \frac{\varepsilon E_p^{SU}}{\beta\gamma} \quad (110)$$

Equation (110) shows that the motion ratio (i.e., Equation (104) and the area ratio (i.e., Equation (102)) can reduce the pressure that can be applied for a given strain. Further, Equation (110) may be useful is assessing material or actuator selections as maximum strain is frequently cited as a specification in both.

The deflection d of the piezo stack 2030 may be given as:

$$d = \frac{\beta\gamma PD_0}{E_p^{SU}} \quad (111)$$

The equivalent stiffness of the piezo stack 2030 may be given as:

$$k_{eq} = \frac{A_{stack}E_p^{SU}}{D_o} \quad (112)$$

Typically, it is desirable that any load-bearing element (e.g., a sealing diaphragm) connected to the "ground" between the piezo stack (e.g., 2030) and the fluid has a much lower stiffness than the piezo stack. Assuming this condition is met, the majority of force goes into deflecting the piezo stack 2030 as opposed to deflecting such intermediary structures. Alternatively, the structure is not connected to "ground" (e.g., spacers), such considerations do not apply.

Simulation

Figure 21:
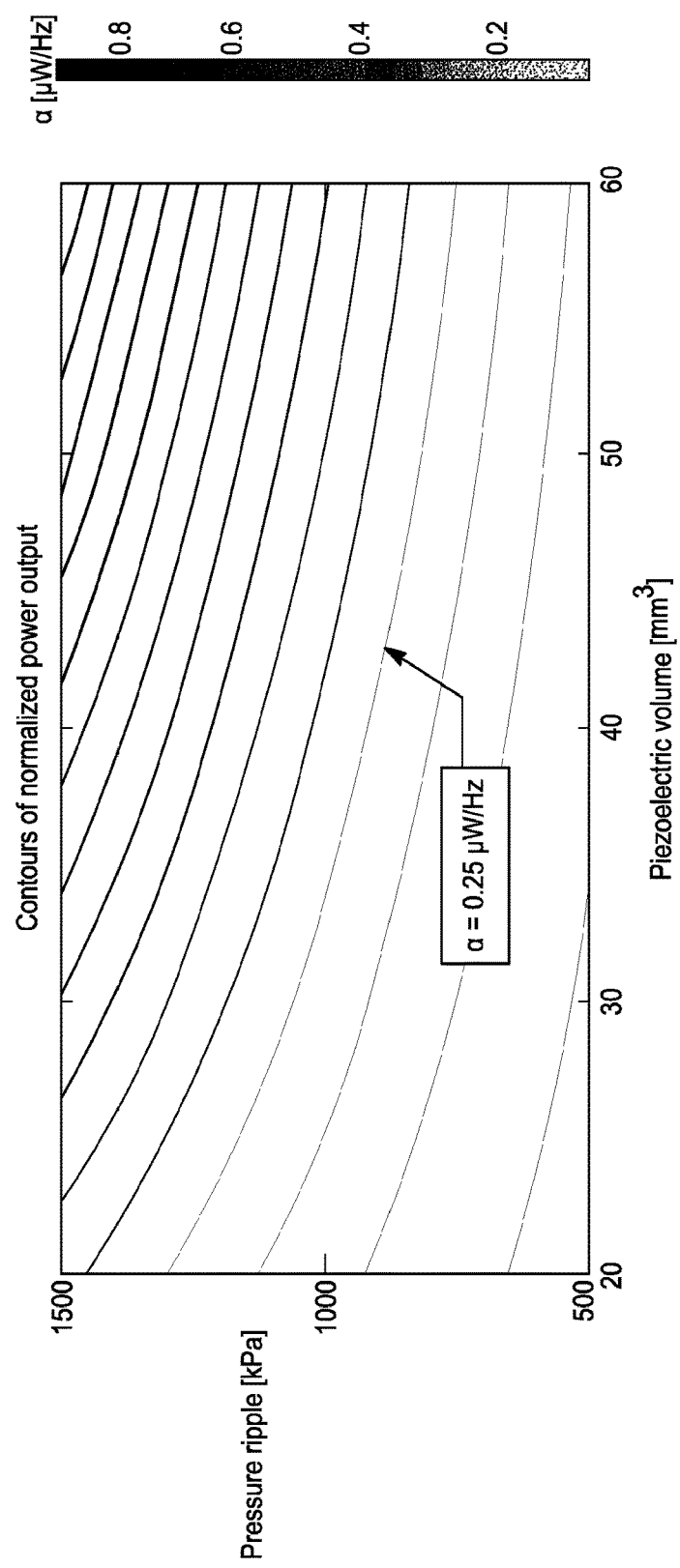
FIG. 21 shows contours of the normalized power output for various combinations of the pressure ripple and volume of piezoelectric material for the case of harmonic hydraulic pressure fluctuation at 270 Hz and prismatic piezoelectric insert made of PZT-5A, according to an exemplary embodiment.
Figure 22:
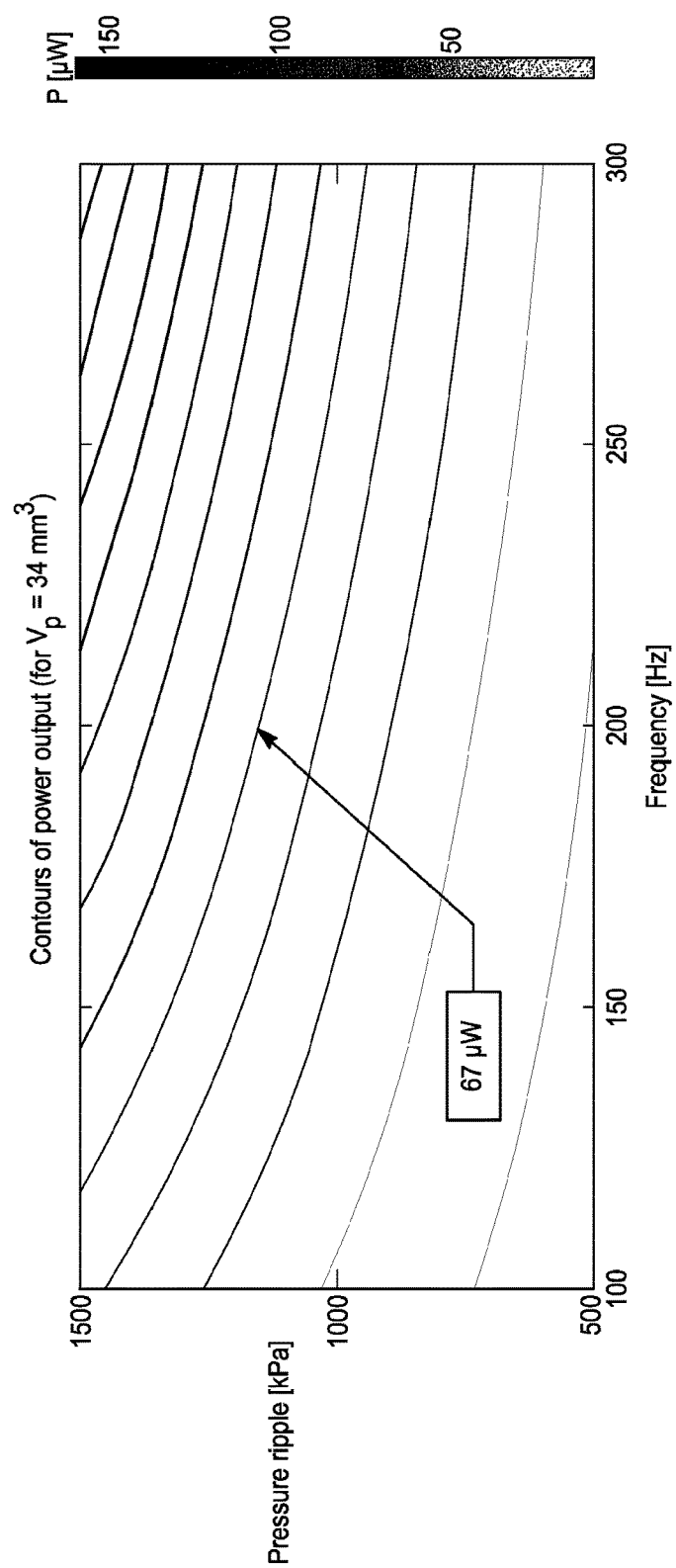
FIG. 22 shows contours of constant power output for different combinations of the pressure ripple and frequency for a constant PZT volume.
Figure 23:
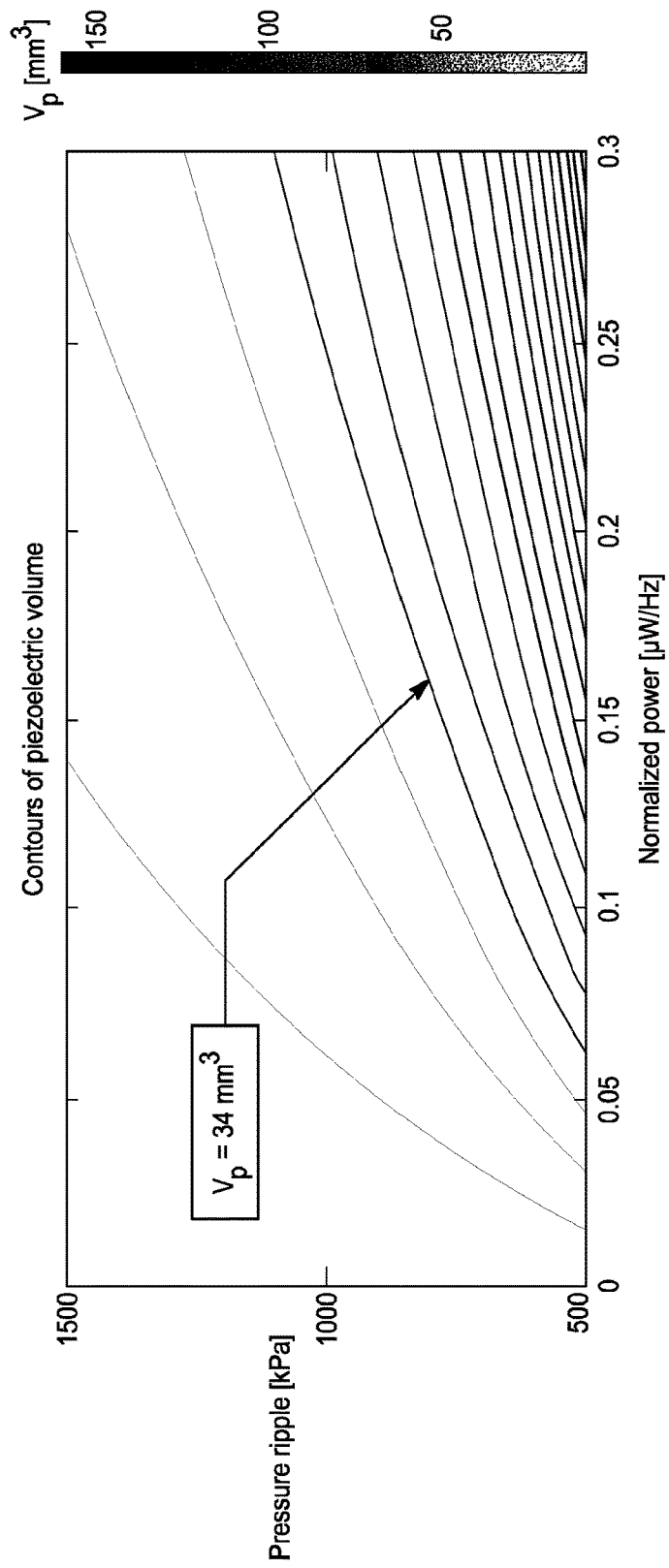
FIG. 23 shows contours of constant piezoelectric volume for different combinations of the pressure ripple at 270 Hz and PZT-5A volume.

FIG. 21 shows contours of the normalized power output for various combinations of the pressure ripple and volume of piezoelectric material for the case of harmonic hydraulic pressure fluctuation at 270 Hz and prismatic piezoelectric insert made of PZT-5A ($d_{33}$=374 pm/V, $\varepsilon_{33}^T$=15.05 nF/m). FIG. 22 depicts contours of constant power output for different combinations of the pressure ripple and frequency for a constant PZT volume (i.e., 34 mm³ PZT-5A volume), and FIG. 23 shows contours of constant piezoelectric volume for different combinations of the pressure ripple at 270 Hz and PZT-5A volume. As will be understood and appreciated, FIGS. 21-23 illustrate the high degree of design flexibility for different applications and hydraulic pressure ripple conditions.

The foregoing description of the exemplary embodiments has been presented only for the purposes of illustration and description and is not intended to be exhaustive or to limit the inventions to the precise forms disclosed. Many modifications and variations are possible in light of the above teaching.

The embodiments were chosen and described in order to explain the principles of the inventions and their practical application so as to enable others skilled in the art to utilize the inventions and various embodiments and with various modifications as are suited to the particular use contemplated. Alternative embodiments will become apparent to those skilled in the art to which the present inventions pertain without departing from their spirit and scope. Accordingly, the scope of the present inventions is defined by the appended claims rather than the foregoing description and the exemplary embodiments described therein.

The invention claimed is:

1. A system comprising:
a housing configured as an annulus;
a piezoelectric stack in fluid communication with a pressure ripple of a fluid system and configured to generate a piezoelectric voltage and an associated piezoelectric current in response to pressure ripple characteristics, wherein the piezoelectric stack is disposed within the housing, and wherein the piezoelectric stack comprises an axially-poled piezoelectric layer; and
regulatory circuitry in electrical communication with the piezoelectric stack and configured to convert the piezoelectric current into DC voltage.

2. The system of claim 1, wherein the piezoelectric stack comprises a plurality of axially-poled piezoelectric layers combined in parallel; and
wherein the piezoelectric stack is shunted through the regulatory circuitry.

3. The system of claim 1, wherein pressure ripple characteristics comprise hydraulic pressure fluctuations.

4. The system of claim 1 further comprising an interface comprising a top surface and a bottom surface;
wherein the piezoelectric stack comprises a top surface and a bottom surface; and
wherein the bottom surface of the interface is in fluid communication with the pressure ripple of the fluid system and the top surface of the interface is in mechanical communication with the bottom surface of the piezoelectric stack.

5. The system of claim 1 further comprising an interface comprising a top surface and a bottom surface;
wherein the interface is configured to transfer pressure ripple characteristics to the piezoelectric stack.

6. The system of claim 4 further comprising a force transmission element comprising a top surface and a bottom surface disposed between the piezoelectric stack and the interface, wherein the top surface of the force transmission element is in mechanical communication with the bottom surface of the piezoelectric stack and the bottom surface of the force transmission element is in mechanical communication with the top surface of the interface.

7. The system of claim 1 further comprising a force transmission element configured to ensure uniform loading across a bottom surface of the piezoelectric stack.

8. The system of claim 1 further comprising a force transmission element configured to implement area ratios.

9. The system of claim 1 further comprising a force transmission element comprising at least one of a washer and a rigid spacer.

10. A system comprising:
a housing;
a piezoelectric stack in fluid communication with a pressure ripple of a fluid system and configured to generate a piezoelectric voltage and an associated piezoelectric current in response to pressure ripple characteristics, wherein the piezoelectric stack is disposed within the housing, and wherein the piezoelectric stack comprises an axially-poled piezoelectric layer; and
regulatory circuitry in electrical communication with the piezoelectric stack and configured to convert the piezoelectric current into DC voltage;
wherein the piezoelectric stack comprises a top surface and a bottom surface, and wherein the housing is configured such that the system can be threaded through at least one of an interior wall and an exterior wall of a conduit of a fluid system such that when the system is substantially seated, the bottom surface of the piezoelectric stack and an interior wall of the conduit are substantially aligned.

11. The system of claim 10 further comprising an interface;
wherein the housing is an outer housing comprising a body disposed between a first end and a second end;
wherein the piezoelectric stack is a multilayer piezoelectric stack comprising a plurality of the axially-poled piezoelectric layers combined in parallel, and comprising a top surface and a bottom surface;
wherein the interface comprises a top surface and a bottom surface, wherein the bottom surface of the interface is in fluid communication with a pressure ripple of a fluid system and the top surface of the interface is in mechanical communication with the bottom surface of the multilayer piezoelectric stack, and wherein the interface is configured to transfer pressure ripple characteristics to the piezoelectric stack; and
wherein the multilayer piezoelectric stack is shunted through the regulatory circuitry, wherein the piezoelectric current is associated with the piezoelectric voltage, and the piezoelectric current flows into the regulatory circuitry from the multilayer piezoelectric stack.

12. The system of claim 11 further comprising:
an end cap configured for detachable attachment to a first end of the outer housing, wherein the end cap comprises a top surface and a bottom surface;

an inner sleeve comprising a body disposed between a first end and a second end, wherein the inner sleeve is disposed within the outer housing, and wherein the multilayer piezoelectric stack is disposed within the inner sleeve;

a keyed spacer comprising a top surface and a bottom surface, wherein the bottom surface of the keyed spacer is in mechanical communication with the top surface of the multilayer piezoelectric stack and the first end of the inner sleeve, and wherein the top surface of the keyed spacer is in mechanical communication with the bottom surface of the end cap; and a force transmission element comprising a top surface and a bottom surface, wherein the interface spacer is disposed between the multilayer piezoelectric stack and the interface such that the top surface of the interface spacer is in mechanical communication with the bottom surface of the multilayer piezoelectric stack and the bottom surface of the interface spacer is in mechanical communication with the top surface of the interface.

13. The system of claim 12, wherein the force transmission element is configured to ensure uniform loading across the bottom surface of the multilayer piezoelectric stack.

14. The system of claim 12, wherein the force transmission element is configured to implement area ratios.

15. The system of claim 11, wherein the force transmission element comprises at least one of a washer and a rigid spacer;

wherein the outer housing comprises an interior and an exterior;

wherein the second end of the outer housing is sealed such that fluid from the fluid system cannot penetrate the interior of the housing;

wherein the second end of the outer housing is sealed to ensure that the multilayer piezoelectric stack is under uniaxial loading from the pressure ripple characteristics; and wherein the piezoelectric current is an AC current, and wherein the regulatory circuitry comprises:

an AC-to-DC converter, wherein the AC-to-DC converter is configured to convert the piezoelectric current flowing from the multilayer piezoelectric stack into the AC-to-DC converter to a DC current;

a smoothing capacitor, wherein the smoothing capacitor is configured to obtain a constant voltage from the DC current flowing from the AC-to-DC converter to the smoothing capacitor; and a DC-to-DC regulator, wherein the DC-to-DC regulator is configured to regulate the voltage obtained by the smoothing capacitor to reach a predetermined voltage level associated with an external storage component.

16. The system of claim 15, wherein the AC-to-DC converter is a full-wave rectifier.

17. The system of claim 15 further comprising at least one additional multilayer piezoelectric stack comprising a plurality of axially-poled piezoelectric layers combined in parallel, and comprising a top surface and a bottom surface, wherein the at least one additional multilayer piezoelectric stack is disposed within the body of the outer housing, and wherein the at least one additional multilayer piezoelectric stack is configured to generate a piezoelectric voltage in response to pressure ripple characteristics.

18. The system of claim 10, wherein the piezoelectric stack comprises a plurality of axially-poled piezoelectric layers combined in parallel; and wherein the piezoelectric stack is shunted through the regulatory circuitry.

19. The system of claim 10, wherein pressure ripple characteristics comprise hydraulic pressure fluctuations.

20. A system comprising:

a housing configured as an annulus;

a piezoelectric stack in fluid communication with a pressure ripple of a fluid system and configured to generate a piezoelectric voltage and an associated piezoelectric current in response to pressure ripple characteristics, wherein the piezoelectric stack is disposed within the housing, and wherein the piezoelectric stack comprises an axially-poled piezoelectric layer; and regulatory circuitry in electrical communication with the piezoelectric stack and configured to convert the piezoelectric current into DC voltage;

wherein the piezoelectric stack comprises a top surface and a bottom surface, and wherein the housing is configured such that the system can be threaded through at least one of an interior wall and an exterior wall of a conduit of a fluid system such that when the system is substantially seated, the bottom surface of the piezoelectric stack and an interior wall of the conduit are substantially aligned.

* * * * *